US011158806B2

(12) United States Patent
Adachi et al.

(10) Patent No.: US 11,158,806 B2
(45) Date of Patent: Oct. 26, 2021

(54) FILM FOR LIGHT EMITTING DEVICE AND LIGHT EMITTING DEVICE USING THE SAME

(71) Applicant: Sumitomo Chemical Company, Limited, Tokyo (JP)

(72) Inventors: Tatsuhiko Adachi, Osaka (JP); Mio Shiratori, Tsukuba (JP); Takuya Mori, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/643,032

(22) PCT Filed: Sep. 18, 2019

(86) PCT No.: PCT/JP2019/036459
§ 371 (c)(1),
(2) Date: Feb. 28, 2020

(87) PCT Pub. No.: WO2020/075453
PCT Pub. Date: Apr. 16, 2020

(65) Prior Publication Data
US 2021/0151684 A1 May 20, 2021

(30) Foreign Application Priority Data
Oct. 10, 2018 (JP) .............................. JP2018-191446

(51) Int. Cl.
*H01L 51/00* (2006.01)
*C08G 61/12* (2006.01)
*G01N 24/08* (2006.01)
*H01L 51/50* (2006.01)

(52) U.S. Cl.
CPC ........ *H01L 51/0039* (2013.01); *C08G 61/122* (2013.01); *G01N 24/087* (2013.01); *H01L 51/0043* (2013.01); *C08G 2261/124* (2013.01); *C08G 2261/148* (2013.01); *C08G 2261/1412* (2013.01); *C08G 2261/18* (2013.01); *C08G 2261/228* (2013.01); *C08G 2261/312* (2013.01); *C08G 2261/3142* (2013.01); *C08G 2261/3221* (2013.01); *C08G 2261/512* (2013.01); *C08G 2261/76* (2013.01); *C08G 2261/95* (2013.01); *H01L 51/5012* (2013.01); *H01L 51/5056* (2013.01)

(58) Field of Classification Search
CPC .......... C08G 61/122; C08G 2261/1412; C08G 2261/148; C08G 2261/124; C08G 2261/18; C08G 2261/228; C08G 2261/312; C08G 2261/3142; C08G 2261/3221; C08G 2261/512; C08G 2261/3162; C08G 2261/76; C08G 2261/95; H01L 51/0043; H01L 51/0039; H01L 51/5012; H01L 51/5056; G01N 24/087; C08L 79/02

See application file for complete search history.

(56) References Cited

U.S. PATENT DOCUMENTS

| 2011/0108814 A1 | 5/2011 | Iida et al. |
| 2018/0308419 A1 | 10/2018 | Asada |

FOREIGN PATENT DOCUMENTS

| EP | 3351576 A1 | 7/2018 |
| JP | 2007240359 A | 9/2007 |
| JP | 2008-198989 A | 8/2008 |
| JP | 2011052229 A | 3/2011 |
| JP | 2016-167570 A | 9/2016 |
| KR | 20180081083 A | 7/2018 |
| WO | 2017/154882 A1 | 9/2017 |

OTHER PUBLICATIONS

Office Action dated Feb. 20, 2019 in JP Application No. 2018191446.
Office Action dated Jul. 2, 2020 in KR Application No. 1020207005572.
Extended European Search Report dated Oct. 22, 2020 in EP Application No. 19850804.6.
Office Action dated Dec. 2, 2020 in CN Application No. 201980004263.0.
Int'l Search Report and Written Opinion dated Dec. 24, 2019 in Int'l Application No. PCT/JP2019/036459.
Office Action dated Jul. 28, 2021 in CN Application No. 201980004263.0.
Office Action dated Jul. 29, 2021 in EP Application No. 19850804.6.

*Primary Examiner* — Shane Fang
(74) *Attorney, Agent, or Firm* — Panitch Schwarze Belisario & Nadel LLP

(57) ABSTRACT

A film for a light emitting device which is useful for producing a light emitting device having excellent luminance life is described. The film contains a cross-linked body of a crosslinkable material having a crosslinking group in an amount of 0.015 mmol/g to 0.05 mmol/g. A light emitting device containing the film is also described. A method for analyzing a crosslinking group in a film for a light emitting device involves: (1) a step of swelling the above-described film for a light emitting device with a solvent, and (2) a step of measuring a crosslinking group of the swollen film for a light emitting device using nuclear magnetic resonance spectroscopy.

7 Claims, 1 Drawing Sheet

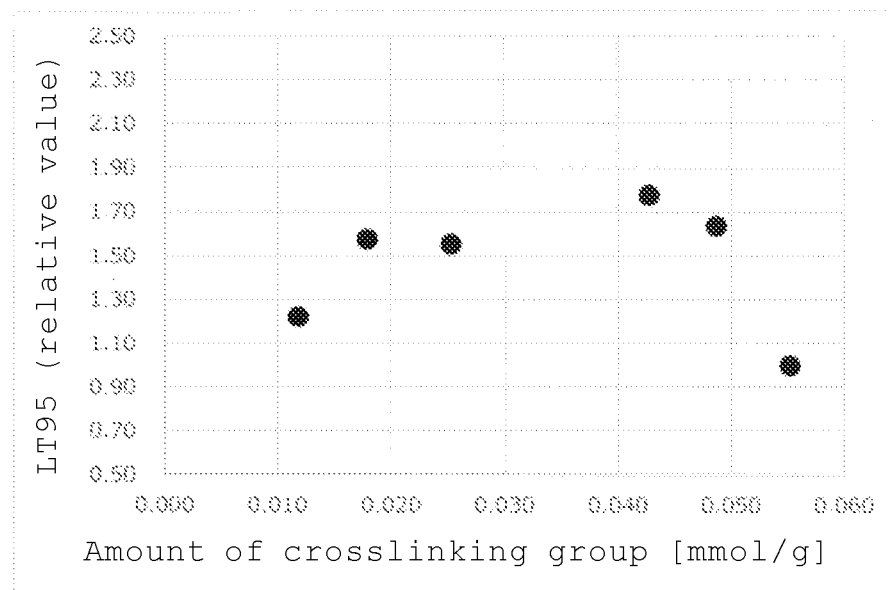

FILM FOR LIGHT EMITTING DEVICE AND LIGHT EMITTING DEVICE USING THE SAME

CROSS-REFERENCE TO RELATED APPLICATIONS

This application is a Section 371 of International Application No. PCT/JP2019/036459, filed Sep. 18, 2019, which has not yet published, which claims priority under 35 U.S.C. § 119(b) to Japanese Application No. 2018-191446, filed on Oct. 10, 2018, the disclosures of which are incorporated herein by reference in their entireties.

TECHNICAL FIELD

The present invention relates to a film for light emitting device and a light emitting device using the same.

BACKGROUND ART

Light emitting devices such as an organic electroluminescent device and the like can be suitably used for applications of display and illumination. As a film used for a light emitting device, for example, Patent Documents 1 and 2 suggest a film obtained by heating a polymer compound having a crosslinking group at 180° C. or 230° C. for 60 minutes to crosslink the polymer compound.

PRIOR ART DOCUMENT

Patent Document

[Patent Document 1] International Publication WO2017/154882
[Patent Document 2] JP-A No. 2011-52229

SUMMARY OF THE INVENTION

Problem to be Solved by the Invention

However, a light emitting device produced by using the film for light emitting device described above was not necessarily sufficient in luminance life.

Then, the present invention has an object of providing a film for light emitting device which is useful for production of a light emitting device excellent in luminance life.

Means for Solving the Problem

The present inventors have intensively studied for solving the above-described problem and resultantly found a method for quantifying a crosslinking group contained in a film for light emitting device, and further found that it is possible to significantly improve the luminance life of a light emitting device produced by using the film for light emitting device by setting the amount of a crosslinking group contained in the film for light emitting device in a predetermined range by using the method. Based on such finding, the present inventors have further investigated additionally, leading to completion of the present invention The present invention provides the following [1] to [8].

[1] A film for light emitting device comprising a cross-linked body having a crosslinking group, wherein the above-described cross-linked body having a crosslinking group is a cross-linked body of a crosslinkable material having a crosslinking group and the amount of the above-described crosslinking group contained in the film for light emitting device is 0.015 mmol/g to 0.05 mmol/g.

[2] The film for light emitting device according to [1], wherein the above-described crosslinkable material is a low molecular weight compound having at least one crosslinking group selected from Group A of crosslinking group or a polymer compound containing a constitutional unit having at least one crosslinking group selected from Group A of crosslinking group:

(Group A of Crosslinking Group)

[Chemical Formula 1]

 (XL-1)

 (XL-2)

 (XL-3)

 (XL-4)

 (XL-5)

(XL-6)

(XL-7)

(XL-8)

(XL-9)

(XL-10)

(XL-11) 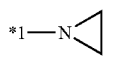

(XL-12) 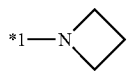

(XL-13) 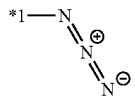

(XL-14) 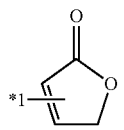

(XL-15) 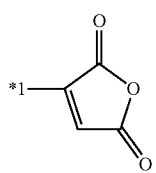

(XL-16) 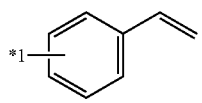

(XL-17) 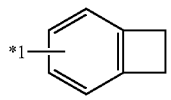

(XL-18) 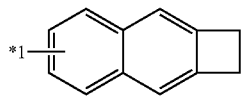

(XL-19) 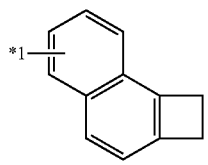

[wherein, $R^{XL}$ represents a methylene group, an oxygen atom, a sulfur atom or —CO—, and $n^{XL}$ represents an integer of 0 to 5. When a plurality of $R^{XL}$ are present, they may be the same or different. A plurality of $n^{XL}$ may be the same or different. *1 represents a binding position. The foregoing crosslinking groups optionally have a substituent, and when a plurality of the substituents are present, they may be combined together to form a ring together with carbon atoms to which they are attached.].

[3] The film for light emitting device according to [2], wherein the above-described crosslinkable material is the above-described polymer compound containing a constitutional unit having at least one crosslinking group selected from Group A of crosslinking group, and the above-described constitutional unit is a constitutional unit represented by the formula (Z) or a constitutional unit represented by the formula (Z'):

[Chemical Formula 2]

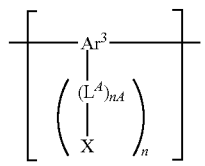

(Z)

[wherein, nA represents an integer of 0 to 5, and n represents an integer of 1 to 4. When a plurality of nA are present, they may be the same or different. $Ar^3$ represents an aromatic hydrocarbon group or a heterocyclic group, and the foregoing groups optionally have a substituent. $L^A$ represents an alkylene group, a cycloalkylene group, an arylene group, a divalent heterocyclic group, a group represented by —N(R')—, an oxygen atom or a sulfur atom, and the foregoing groups optionally have a substituent. R' represents a hydrogen atom, an alkyl group, a cycloalkyl group, an aryl group or a monovalent heterocyclic group, and the foregoing groups optionally have a substituent. When a plurality of $L^A$ are present, they may be the same or different. X represents the above-described crosslinking group selected from Group A of crosslinking group. When a plurality of X are present, they may be the same or different.]

[Chemical Formula 3]

$$\left[ -Ar^4-\underset{\underset{X'}{|}}{\underset{(K^A)_{mA}}{|}}{N}- \left( Ar^5 \underset{\underset{X'}{|}}{\underset{(K^A)_{mA}}{|}} \right)_m \underset{\underset{X'}{|}}{\underset{(K^A)_{mA}}{|}}{N} \right)_c Ar^6 \right] \quad (Z')$$

[wherein, mA represents an integer of 0 to 5, m represent an integer of 1 to 4, and c represents 0 or 1. When a plurality of mA are present, they may be the same or different. $Ar^5$ represents an aromatic hydrocarbon group, a heterocyclic group, or a group in which at least one aromatic hydrocarbon group and at least one heterocyclic group are bonded directly, and the foregoing groups optionally have a substituent. $Ar^4$ and $Ar^6$ each independently represent an arylene group or a divalent heterocyclic group, and the foregoing groups optionally have a substituent. $Ar^4$, $Ar^5$ and $Ar^6$ may be bonded directly or via an oxygen atom or a sulfur atom to groups other than these groups bonded to a nitrogen atom to which these groups are attached, to form a ring, respectively. $K^A$ represents an alkylene group, a cycloalkylene group, an arylene group, a divalent heterocyclic group, a group represented by —N(R'')—, an oxygen atom or a sulfur atom, and the foregoing groups optionally have a substituent. R'' represents a hydrogen atom, an alkyl group, a cycloalkyl group, an aryl group or a monovalent heterocyclic group, and the foregoing groups optionally have a substituent. When a plurality of $K^A$ are present, they may be the same or different. X' represents the above-described crosslinking group selected from Group A of crosslinking group, a hydrogen atom, an alkyl group, a cycloalkyl group, an aryl group or a monovalent heterocyclic group, and the foregoing groups optionally have a substituent. When a plurality of X' are present, they may be the same or different. At least one X' is the above-described crosslinking group selected from Group A of crosslinking group.].

[4] The film for light emitting device according to [2], wherein the above-described crosslinkable material is a low molecular weight compound represented by the formula (Z''):

[Chemical Formula 4]

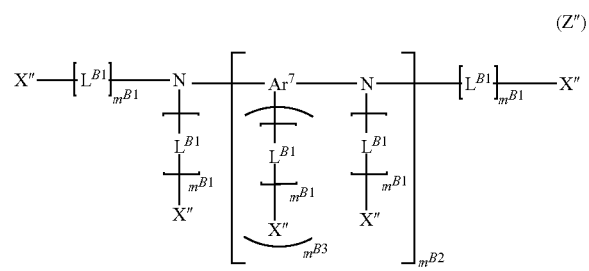

(Z'')

[wherein, $m^{B1}$, $m^{B2}$ and $m^{B3}$ each independently represent an integer of 0 or more and 10 or less. A plurality of $m^{B1}$ may be the same or different. When a plurality of $m^{B3}$ are present, they may be the same or different. $Ar^7$ represents an aromatic hydrocarbon group, a heterocyclic group, or a group in which at least one aromatic hydrocarbon group and at least one heterocyclic group are bonded directly, and the foregoing groups optionally have a substituent. When a plurality of $Ar^7$ are present, they may be the same or different. $L^{B1}$ represents an alkylene group, a cycloalkylene group, an arylene group, a divalent heterocyclic group, a group represented by —N(R''')—, an oxygen atom or a sulfur atom, and the foregoing groups optionally have a substituent. R''' represents a hydrogen atom, an alkyl group, a cycloalkyl group, an aryl group or a monovalent heterocyclic group, and the foregoing groups optionally have a substituent. When a plurality of $L^{B1}$ are present, they may be the same or different. X'' represents the above-described crosslinking group selected from Group A of crosslinking group, a hydrogen atom, an alkyl group, a cycloalkyl group, an aryl group or a monovalent heterocyclic group, and the foregoing groups optionally have a substituent. A plurality of X'' may be the same or different. Of the plurality of X'', at least one is the above-described crosslinking group selected from Group A of crosslinking group.].

[5] The film for light emitting device according to any one of [2] to [4], wherein the above-described crosslinking group includes a crosslinking group represented by the above-described formula (XL-1), the above-described formula (XL-16), the above-described formula (XL-17), the above-described formula (XL-18) or the above-described formula (XL-19.

[6] The film for light emitting device according to any one of [1] to [5], further comprising at least one selected from the group consisting of a hole transporting material, a hole injection material, an electron transporting material, an electron injection material, a light emitting material and an antioxidant.

[7] A light emitting device having an anode, a cathode and an organic layer, wherein the above-described organic layer is disposed between the above-described anode and the above-described cathode, and the above-described organic layer is the film for light emitting device according to any one of [1] to [6].

[8] A method for analyzing (quantifying) a crosslinking group in a film for light emitting device, comprising
(1) a step of swelling the above-described film for light emitting device with a solvent, and
(2) a step of measuring a crosslinking group of the swollen film for light emitting device using nuclear magnetic resonance spectroscopy.

Effect of the Invention

According to the present invention, a film for light emitting device which is useful for production of a light emitting device excellent in luminance life can be provided. Further, according to the present invention, a light emitting device comprising the film for light emitting device can be provided.

BRIEF EXPLANATION OF DRAWING

The FIGURE is a graph showing the correlation between the content of a crosslinking group and the luminance life (LT95) in the films for light emitting device used in Examples 1 to 4 and Comparative Examples 1 to 2.

MODES FOR CARRYING OUT THE INVENTION

Suitable embodiments of the present invention will be illustrated in detail below.

1. Explanation of Common Terms

Terms commonly used in the present specification have the following meanings unless otherwise stated.

Me represents a methyl group, Et represents an ethyl group, Bu represents a butyl group, i-Pr represents an isopropyl group and t-Bu represents a tert-butyl group.

A hydrogen atom may be a heavy hydrogen atom or a light hydrogen atom.

In the formula representing a metal complex, the solid line representing a bond with a metal means an ionic bond, a covalent bond or a coordination bond.

"Polymer compound" means a polymer having molecular weight distribution and having a polystyrene-equivalent number-average molecular weight of $1\times10^3$ to $1\times10^8$.

The polymer compound may be any of a block copolymer, a random copolymer, an alternating copolymer and a graft copolymer, and may also be another form.

The end group of the polymer compound is preferably a stable group since if a polymerization active group remains intact there, there is a possibility of a decrease in a light emitting property or luminance life when the polymer compound is used for fabrication of a light emitting device. The end group of the polymer compound is preferably a group conjugatively bonded to the main chain and includes, for example, an aryl group or a monovalent hetero ring group bonding to the main chain of the polymer compound via a carbon-carbon bond.

"Low molecular weight compound" means a compound having no molecular weight distribution and having a molecular weight of $1\times10^4$ or less.

"Constitutional unit" means a unit occurring once or more times in the polymer compound.

"Alkyl group" may be any of linear and branched. The number of carbon atoms of the linear alkyl group is usually 1 to 50, preferably 3 to 30, more preferably 4 to 20. The number of carbon atoms of the branched alkyl group is usually 3 to 50, preferably 3 to 30, more preferably 4 to 20.

The alkyl group optionally has a substituent and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom and the like (for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl)propyl group, a 6-ethyloxyhexyl group).

The number of carbon atoms of "cycloalkyl group" is usually 3 to 50, preferably 3 to 30, more preferably 4 to 20.

The cycloalkyl group optionally has a substituent and examples thereof include a cyclohexyl group, a cyclohexylmethyl group and a cyclohexylethyl group.

"Aryl group" means an atomic group remaining after removing from an aromatic hydrocarbon one hydrogen atom bonding directly to a carbon atom constituting the ring. The number of carbon atoms of the aryl group is usually 6 to 60, preferably 6 to 20, more preferably 6 to 10.

The aryl group optionally has a substituent and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group, and groups obtained by substituting a hydrogen atom in these groups with an alkyl group, a cycloalkyl group, an alkoxy group, a cycloalkoxy group, an aryl group, a fluorine atom and the like.

"Alkoxy group" may be any of linear and branched. The number of carbon atoms of the linear alkoxy group is usually 1 to 40, preferably 4 to 10. The number of carbon atoms of the branched alkoxy group is usually 3 to 40, preferably 4 to 10.

The alkoxy group optionally has a substituent and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of the "cycloalkoxy group" is usually 3 to 40, preferably 4 to 10.

The cycloalkoxy group optionally has a substituent and examples thereof include a cyclohexyloxy group.

The number of carbon atoms of the "aryloxy group" is usually 6 to 60, preferably 6 to 48.

The aryloxy group optionally has a substituent and examples thereof include a phenoxy group, a 1-naphthyloxy group, a 2-naphthyloxy group, a 1-anthracenyloxy group, a 9-anthracenyloxy group and a 1-pyrenyloxy group, and groups obtained by substituting a hydrogen atom in these groups with an alkyl group, a cycloalkyl group, an alkoxy group, a cycloalkoxy group, a fluorine atom or the like.

"p-valent heterocyclic group" (p represents an integer of 1 or more) means an atomic group remaining after removing from a heterocyclic compound p hydrogen atoms among hydrogen atoms bonding directly to carbon atoms or hetero atoms constituting the ring. Of the p-valent heterocyclic groups, "p-valent aromatic heterocyclic group" as an atomic group remaining after removing from an aromatic heterocyclic compound p hydrogen atoms among hydrogen atoms bonding directly to carbon atoms or hetero atoms constituting the ring is preferable.

"Aromatic heterocyclic compound" means a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole and the like, and a compound in which an aromatic ring is condensed to the heterocyclic ring even if the heterocyclic ring itself shows no aromaticity such as phenoxazine, phenothiazine, dibenzoborole, dibenzosilole, benzopyran and the like.

The number of carbon atoms of the monovalent heterocyclic group is usually 2 to 60, preferably 4 to 20.

The monovalent heterocyclic group optionally has a substituent and examples thereof include a thienyl group, a pyrrolyl group, a furyl group, a pyridinyl group, a piperidinyl group, a quinolinyl group, an isoquinolinyl group, a pyrimidinyl group and a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferred. The substituent which the amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl)amino group and a bis(3,5-di-tert-butylphenyl)amino group.

"Alkenyl group" may be any of linear and branched. The number of carbon atoms of the linear alkenyl group is usually 2 to 30, preferably 3 to 20. The number of carbon atoms of the branched alkenyl group is usually 3 to 30, preferably 4 to 20.

The number of carbon atoms of the "cycloalkenyl group" is usually 3 to 30, preferably 4 to 20.

The alkenyl group and the cycloalkenyl group optionally have a substituent and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

"Alkynyl group" may be any of linear and branched. The number of carbon atoms of the alkynyl group is usually 2 to 20, preferably 3 to 20. The number of carbon atoms of the branched alkynyl group is usually 4 to 30, preferably 4 to 20.

The number of carbon atoms of the "cycloalkynyl group" is usually 4 to 30, preferably 4 to 20.

The alkynyl group and the cycloalkynyl group optionally have a substituent and examples thereof include an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

"Arylene group" means an atomic group remaining after removing from an aromatic hydrocarbon two hydrogen atoms bonding directly to carbon atoms constituting the ring. The number of carbon atoms of the arylene group is usually 6 to 60, preferably 6 to 30, more preferably 6 to 18.

The arylene group optionally has a substituent and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group and a chrysenediyl group, and these groups having a substituent, and groups represented by the formula (A-1) to the formula (A-20) are preferable. The arylene group includes groups obtained by bonding a plurality of these groups.

[Chemical Formula 5]

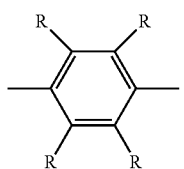
(A-1)

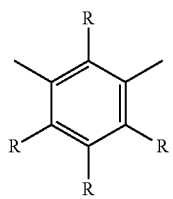
(A-2)

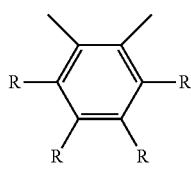
(A-3)

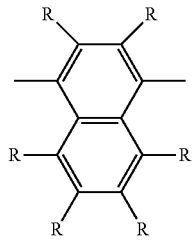
(A-4)

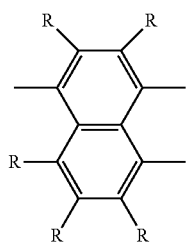
(A-5)

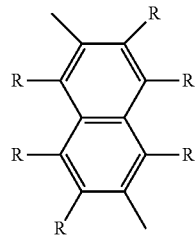
(A-6)

[Chemical Formula 6]

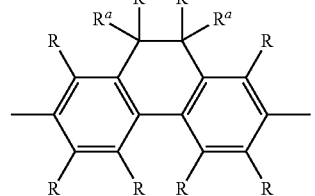
(A-7)

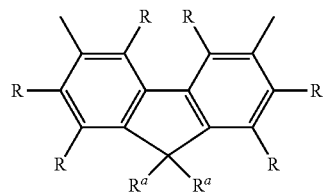
(A-8)

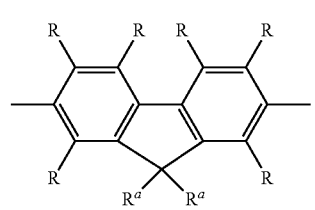
(A-9)

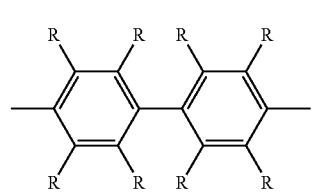
(A-10)

[Chemical Formula 7]

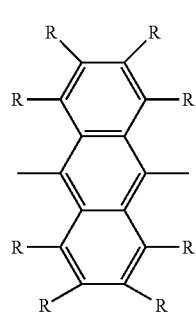
(A-11)

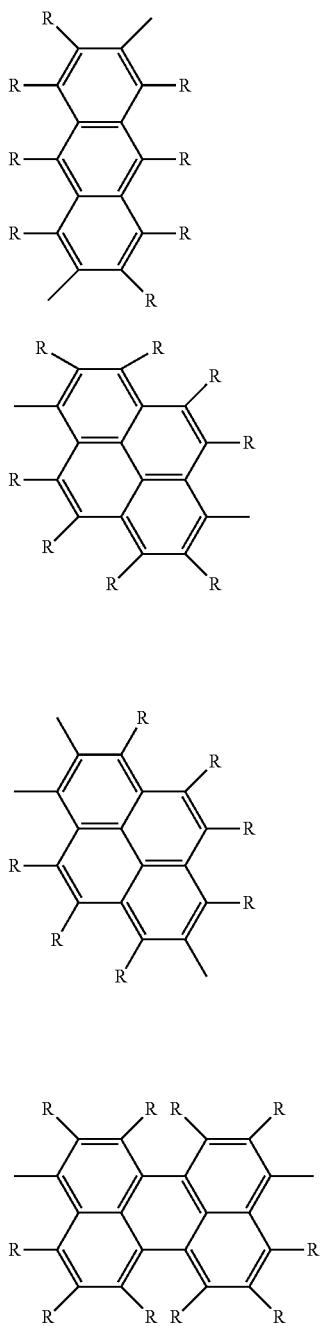

[Chemical Formula 8]

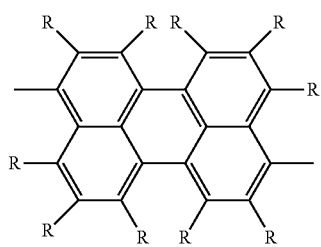

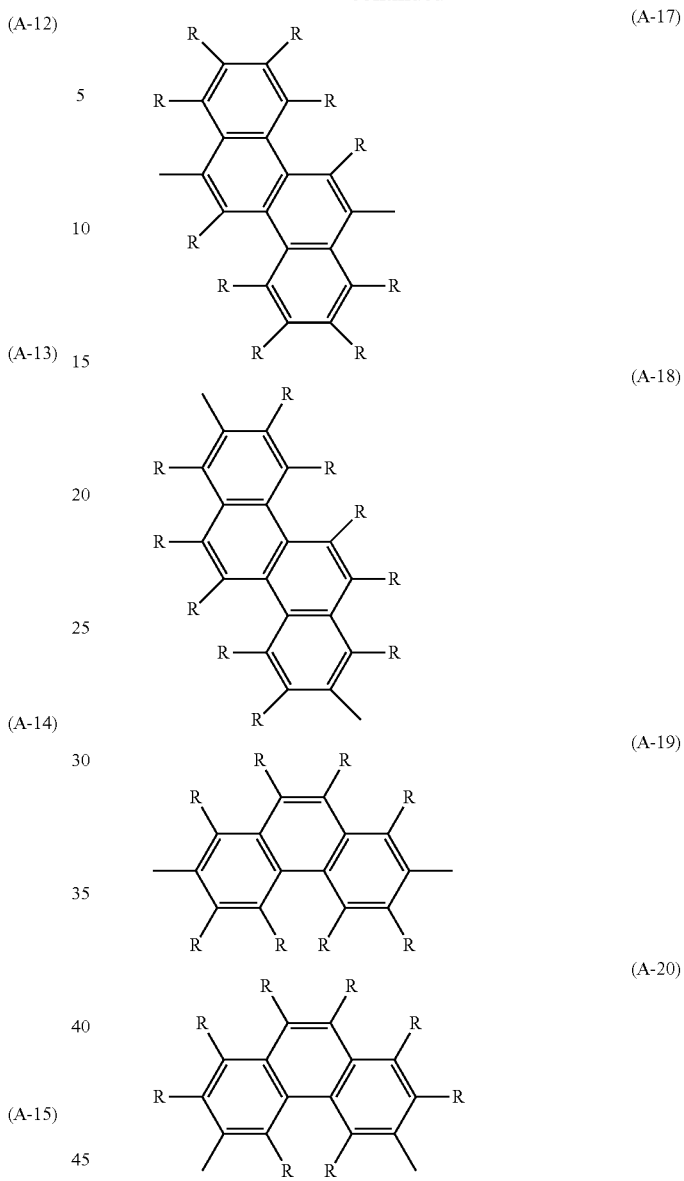

[wherein, R and $R^a$ each independently represent a hydrogen atom, an alkyl group, a cycloalkyl group, an aryl group or a monovalent heterocyclic group. A plurality of R and $R^a$ may be the same or different at each occurrence, and the plurality of $R^a$ may be combined together to form a ring together with atoms to which they are attached.]

The number of carbon atoms of the divalent heterocyclic group is usually 2 to 60, preferably 3 to 20, more preferably 4 to 15.

The divalent heterocyclic group optionally has a substituent and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms bonding directly to carbon atoms or hetero atoms constituting the ring, preferably groups represented by the formula (AA-1) to the formula (AA-34). The divalent heterocyclic group includes groups obtained by bonding a plurality of these groups.

[Chemical Formula 9]
(AA-1)
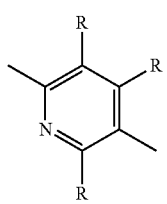
(AA-2)
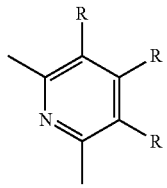
(AA-3)
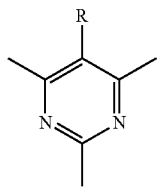
(AA-4)
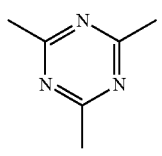
(AA-5)
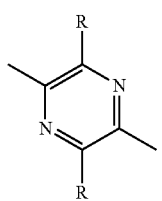
(AA-6)
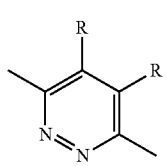
(AA-7)
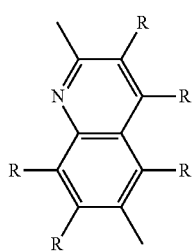
[Chemical Formula 10]
(AA-8)
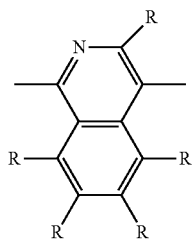
(AA-9)
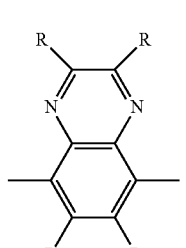
(AA-10)
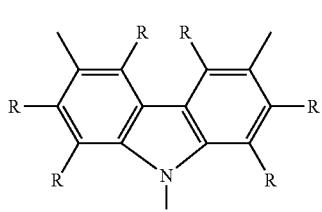
(AA-11)
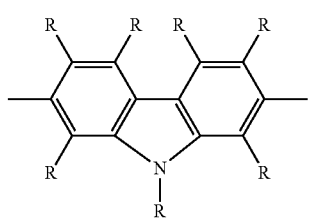
(AA-12)
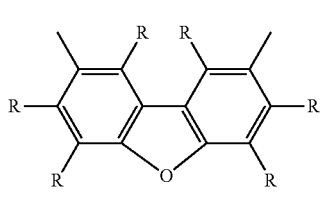
[Chemical Formula 11]
(AA-13)
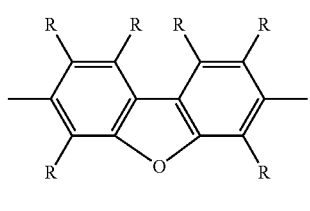
(AA-14)
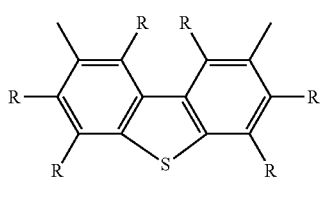

-continued
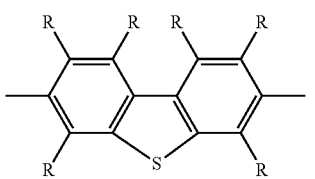
(AA-15)
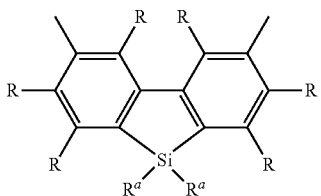
(AA-16)
[Chemical Formula 12]
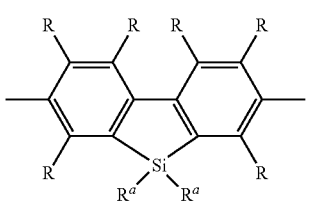
(AA-17)
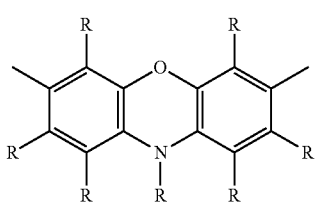
(AA-18)
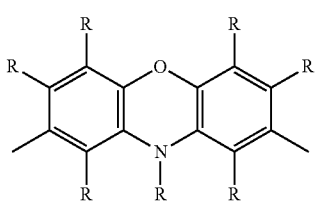
(AA-19)
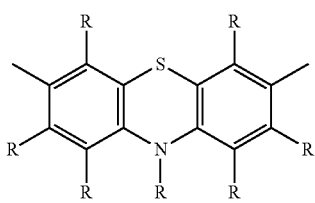
(AA-20)
[Chemical Formula 13]
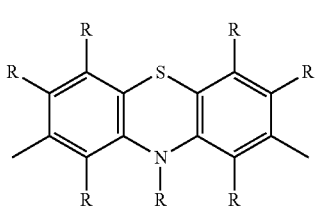
(AA-21)
-continued
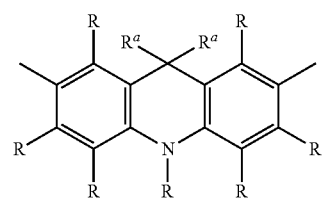
(AA-22)
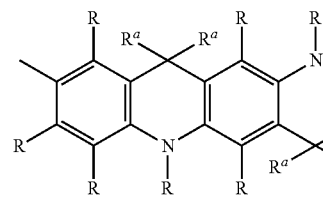
(AA-23)
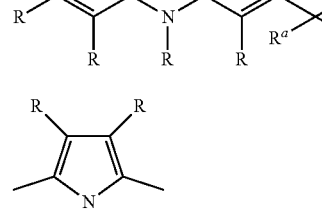
(AA-24)
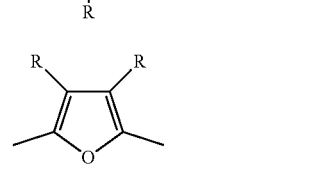
(AA-25)
[Chemical Formula 14]
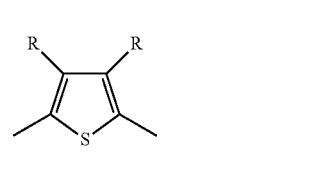
(AA-26)
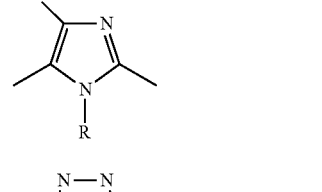
(AA-27)
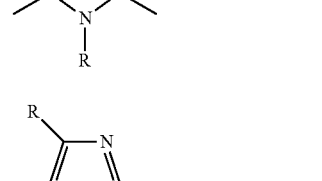
(AA-28)
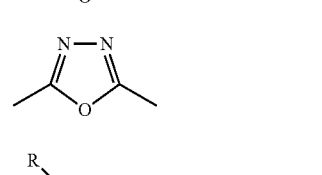
(AA-29)
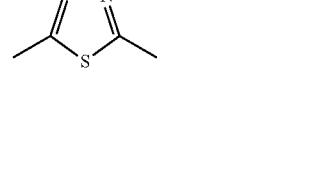
(AA-30)
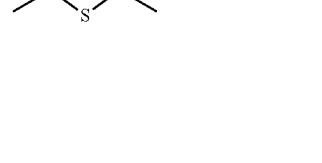
(AA-31)

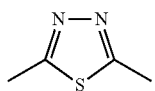
(AA-32)

[Chemical Formula 15]

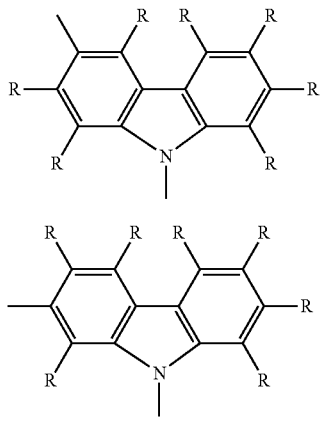

[wherein, R and $R^a$ represent the same meaning as described above.]

"Crosslink group" refers to a group capable of generating a new bond by being subjected to a heating treatment, an ultraviolet irradiation treatment, a near-ultraviolet irradiation treatment, a visible light irradiation treatment, an infrared irradiation treatment, a radical reaction and the like, and includes preferably crosslinking groups represented by the formula (XL-1) to the formula (XL-19), more preferably crosslinking groups represented by the formula (XL-1), the formula (XL-3), the formula (XL-9), the formula (XL-10), the formula (XL-16) to the formula (XL-19), further preferably crosslinking groups represented by the formula (XL-1), the formula (XL-16) to the formula (XL-19), particularly preferably a crosslinking group represented by the formula (XL-1) or the formula (XL-17), in Group A of crosslinking group.

In the formula (XL-2) to the formula (XL-4), the wavy line represents an isomer (preferably, Z body or E body). When a plurality of wavy lines are present, they may be the same or different.

"Substituent" denotes, for example, a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may also be a crosslink group.

2. Film for Light Emitting Device 2.1 Cross-Linked Body Having Crosslinking Group The film for light emitting device of the present invention is characterized by containing a cross-linked body having a prescribed amount of a crosslinking group (hereinafter, also indicated as "cross-linked body"). This cross-linked body is a cross-linked body obtained by crosslinking a crosslinkable material having a crosslinking group (hereinafter, also indicated as "crosslinkable material"). The amount of a crosslinking group contained in the film for light emitting device is 0.015 mmol/g to 0.05 mmol/g. When this crosslinkable material is crosslinked to obtain the cross-linked body, it is possible to leave the unreacted crosslinking group without allowing the crosslinking reaction to proceed completely by selecting the crosslinking conditions. The crosslinking group possessed by the cross-linked body is derived from the crosslinking group possessed by the crosslinkable material as the raw material.

The film for light emitting device of the present invention includes any of a cross-linked body obtained by crosslinking the crosslinkable material in a molecule, a cross-linked body obtained by crosslinking the crosslinkable material between molecules or a cross-linked body obtained by crosslinking the crosslinkable material in a molecule and between molecules.

The film for light emitting device of the present invention is a film obtained by crosslinking a crosslinkable material having a crosslinking group by an external stimulus such as heating, light irradiation and the like. Since the film for light emitting device of the present invention is substantially insolubilized in a solvent, it can be suitably used for lamination of a light emitting device described later.

The amount of the crosslinking group contained in the film for light emitting device of the present invention is 0.015 mmol/g to 0.05 mmol/g, preferably 0.018 mmol/g to 0.049 mmol/g, more preferably 0.030 mmol/g to 0.049 mmol/g, further preferably 0.035 mmol/g to 0.046 mmol/g. When the amount of the crosslinking group contained in the film for light emitting device (content of crosslinking group) is within this range, the luminance life of a light emitting device obtained by using the film for light emitting device is greatly improved.

The thickness of the film for light emitting device of the present invention (film thickness after crosslinking) is usually, 1 nm to 10 μm, preferably 2 nm to 500 nm, more preferably 5 nm to 150 nm.

The film for light emitting device of the present invention can be fabricated by a wet method such as, for example, a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method, a nozzle coat method and the like, using a composition containing a crosslinkable material having a crosslinking group and a solvent (hereinafter, referred to as "ink"). The viscosity of the ink may be adjusted according to the type of the wet method, and it is preferably 1 to 20 mPa·s at 25° C.

The solvent contained in the ink is preferably a solvent capable of dissolving or uniformly dispersing solid components in the ink. The solvent includes, for example, chlorinated hydrocarbon solvents, ether solvents, aromatic hydrocarbon solvents, aliphatic hydrocarbon solvents, ketone solvents, ester solvents, polyhydric alcohol solvents, alcohol solvents, sulfoxide solvents, amide solvents and water.

In the ink, the use amount of the solvent is usually 10 to 1000 parts by mass, preferably 20 to 200 parts by mass with respect to 1 part by mass of a crosslinkable material having a crosslinking group.

For the film for light emitting device of the present invention, the heating temperature for crosslinking is usually, 50° C. to 300° C., preferably 50° C. to 260° C., more preferably 130° C. to 230° C., further preferably 190° C. to 220° C. The heating time is usually 1 minute to 1000 minutes, preferably 5 minutes to 500 minutes, more preferably 10 minutes to 120 minutes, further preferably 20 minutes to 100 minutes, particularly preferably 40 minutes to 80 minutes.

For the film for light emitting device of the present invention, the kind of the light used for irradiation for crosslinking includes, for example, ultraviolet, near-ultraviolet and visible light.

The film for light emitting device of the present invention is suitable as a hole transporting layer or a hole injection layer in a light emitting device.

The film for light emitting device of the present invention may comprise a composition containing the above-described cross-linked body having a crosslinking group and at least one material selected from the group consisting of a hole transporting material, a hole injection material, an electron transporting material, an electron injection material, a light emitting material and an antioxidant. The composition can be produced, for example, by crosslinking the above-described crosslinkable material having a crosslinking group to produce a cross-linked body having a crosslinking group, then, mixing materials such as a hole transporting material and the like, or mixing the above-described crosslinkable material having a crosslinking group and the above-described materials such as a hole transporting material and the like, then, crosslinking the mixture. However, a hole transporting material, a hole injection material, an electron transporting material, an electron injection material are different from the cross-linked body of the crosslinkable material having a crosslinking group.

2.2 Crosslinkable Material Having Crosslinking Group

The above-described cross-linked body having a crosslinking group can be produced, for example, by crosslinking a crosslinkable material having a crosslinking group. The crosslinkable material includes, for example, a polymer compound containing a constitutional unit having a crosslinking group and a low molecular weight compound having a crosslinking group, and a polymer compound containing a constitutional unit having a crosslinking group is preferred.

(1) Polymer Compound Containing Constitutional Unit Having Crosslinking Group

The constitutional unit having a crosslinking group contained in the polymer compound is preferably a constitutional unit having at least one crosslinking group selected from Group A of crosslinking group, more preferably a constitutional unit represented by the formula (Z) or a constitutional unit represented by the formula (Z'). These constitutional units will be described later.

The polymer compound may contain, if necessary, a constitutional unit having no crosslinking group together with the above-described constitutional unit having a crosslinking group. The constitutional unit having no crosslinking group includes, for example, a constitutional unit represented by the formula (Y) and a constitutional unit represented by the formula (X) described later.

The content (molar fraction) of a constitutional unit having a crosslinking group is preferably 0.5 to 80% by mole, more preferably 3 to 65% by mole, further preferably 5 to 50% by mole with respect to the total molar amount of constitutional units contained in the polymer compound containing a constitutional unit having a crosslinking group. Within this range, the polymer compound is excellent in stability and crosslinkability. The constitutional unit having a crosslinking group may be contained only singly or in combination of two or more in the polymer compound.

It is preferable that the polymer compound containing a constitutional unit having a crosslinking group further contains a constitutional unit represented by the formula (X) since excellent hole transportability is obtained. The content (molar fraction) of the constitutional unit represented by the formula (X) is preferably 1 to 80% by mole, more preferably 10 to 70% by mole, further preferably 30 to 60% by mole with respect to the total molar amount of constitutional units contained in the polymer compound. The constitutional unit represented by the formula (X) may be contained only singly or in combination of two or more in the polymer compound containing a constitutional unit having a crosslinking group.

It is preferable that the polymer compound containing a constitutional unit having a crosslinking group further contains a constitutional unit represented by the formula (Y) since the light emitting device of the present embodiment is more excellent in luminance life. The content (molar fraction) of the constitutional unit represented by the formula (Y) is preferably 0.5 to 90% by mole, more preferably 30 to 80% by mole with respect to the total molar amount of the polymer compound. The constitutional unit represented by the formula (Y) may be contained only singly or in combination of two or more in the polymer compound containing a constitutional unit having a crosslinking group.

It is preferable that the polymer compound containing a constitutional unit having a crosslinking group further contains a constitutional unit represented by the formula (X) and a constitutional unit represented by the formula (Y), since hole transportability is excellent and since the light emitting device of the present embodiment is more excellent in luminance life.

The polymer compound containing a constitutional unit having a crosslinking group includes, for example, polymer compounds P-1 to P-8. "Others" mean constitutional units other than constitutional units represented by the formula (Z), the formula (Z'), the formula (X) and the formula (Y).

TABLE 1

| polymer compound | constitutional unit and molar fraction thereof | | | | |
|---|---|---|---|---|---|
| | formula (Z) p' | formula (Z') q' | formula (X) r' | formula (Y) s' | others t' |
| P-1 | 0.1 to 99.9 | 0.1 to 99.9 | 0 | 0 | 0 to 30 |
| P-2 | 0.1 to 9.9 | 0 | 0.1 to 99.9 | 0 | 0 to 30 |
| P-3 | 0.1 to 99.9 | 0 | 0 | 0.1 to 99.9 | 0 to 30 |
| P-4 | 0 | 0.1 to 99.9 | 0.1 to 99.9 | 0 | 0 to 30 |
| P-5 | 0 | 0.1 to 99.9 | 0 | 0.1 to 99.9 | 0 to 30 |
| P-6 | 0.1 to 99.8 | 0.1 to 99.8 | 0.1 to 99.8 | 0 | 0 to 30 |
| P-7 | 0.1 to 99.8 | 0.1 to 99.8 | 0 | 0.1 to 99.8 | 0 to 30 |
| P-6 | 0.1 to 99.7 | 0.1 to 99.7 | 0.1 to 99.7 | 0.1 to 99.7 | 0 to 30 |

[in the table, p', q', r', s' and t' represent the molar fraction (% by mole) of each constitutional unit. p'+q'+r'+s'+t'=100 and 70≤p'+q'+r'+s'≤100.]

The polymer compound containing a constitutional unit having a crosslinking group may be any of a block copolymer, a random copolymer, an alternating copolymer and a graft copolymer, and may also be another form. It is preferably a copolymer obtained by copolymerizing a plurality of raw material monomers.

The polystyrene-equivalent number-average molecular weight of the polymer compound containing a constitutional unit having a crosslinking group is preferably $5 \times 10^3$ to $1 \times 10^6$, more preferably $1 \times 10^4$ to $5 \times 10^5$, further preferably $1.5 \times 10^4$ to $1 \times 10^5$.

The constitutional units represented by the formula (X), the formula (Y), the formula (Z) and the formula (Z') will be explained below.

(1-1) Constitutional Unit Represented by the Formula (Y)

The constitutional unit having no crosslinking group includes, for example, a constitutional unit represented by the formula (Y).

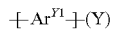  [Chemical Formula 16]

[wherein, $Ar^{Y1}$ represents an arylene group, a divalent heterocyclic group, or a divalent group in which at least one arylene group and at least one divalent heterocyclic group are bonded directly, and the foregoing groups optionally have a substituent.]

The arylene group represented by $Ar^{Y1}$ is preferably a group represented by the formula (A-1) to the formula (A-10), the formula (A-19) or the formula (A-20), more preferably a group represented by the formula (A-1) to the formula (A-3), the formula (A-6) to the formula (A-10), the formula (A-19) or the formula (A-20), further preferably a group represented by the formula (A-1), the formula (A-2), the formula (A-7), the formula (A-9) or the formula (A-19), since the light emitting device of the present embodiment is more excellent in luminance life.

The divalent heterocyclic group represented by $Ar^{Y1}$ is preferably a group represented by the formula (AA-1) to the formula (AA-4), the formula (AA-10) to the formula (AA-15), the formula (AA-18) to the formula (AA-22), the formula (AA-33) or the formula (AA-34), more preferably a group represented by the formula (AA-4), the formula (AA-10), the formula (AA-12) or the formula (AA-14), since the light emitting device of the present embodiment is more excellent in luminance life.

The preferable ranges of the arylene group and the divalent heterocyclic group in the divalent group in which at least one arylene group and at least one divalent heterocyclic group are bonded directly represented by $Ar^{Y1}$ are the same as the preferable ranges of the arylene group and the divalent heterocyclic group represented by $Ar^{Y1}$ described above, respectively.

"The divalent group in which at least one arylene group and at least one divalent heterocyclic group are bonded directly" includes, for example, groups represented by the following formulae, and these groups optionally have a substituent.

[Chemical Formula 17]

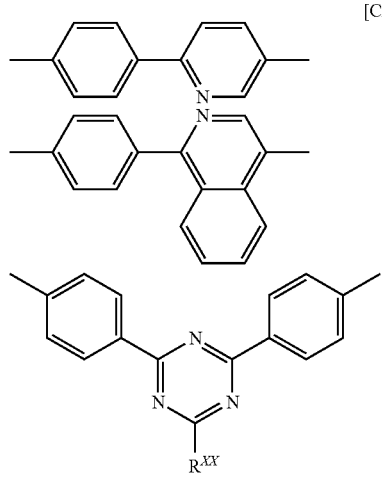

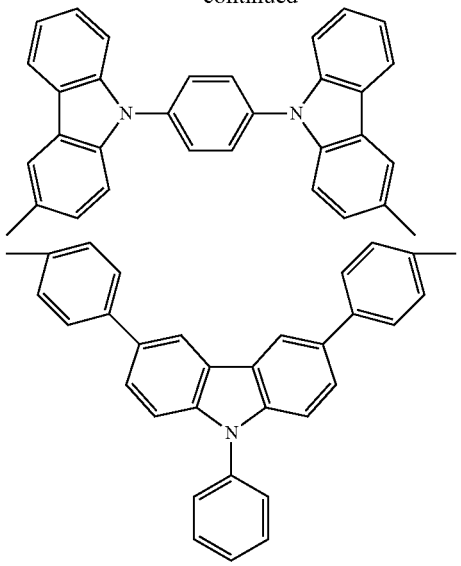

[wherein, $R^{XX}$ represents a hydrogen atom, an alkyl group, a cycloalkyl group, an aryl group or a monovalent heterocyclic group, and the foregoing groups optionally have a substituent.]

$R^{XX}$ is preferably an alkyl group, a cycloalkyl group or an aryl group, and the foregoing groups optionally have a substituent.

The substituent which the group represented by $Ar^{Y1}$ optionally has is preferably an alkyl group, a cycloalkyl group, an alkoxy group, a cycloalkoxy group, an aryl group, a monovalent heterocyclic group or a substituted amino group, more preferably an alkyl group, a cycloalkyl group, an aryl group or a monovalent heterocyclic group, further preferably an alkyl group, a cycloalkyl group or an aryl group, and the foregoing groups optionally further have a substituent.

The substituent which the substituent which the group represented by $Ar^{Y1}$ optionally has optionally further has is preferably an alkyl group, a cycloalkyl group, an aryl group or a monovalent heterocyclic group, more preferably an alkyl group or a cycloalkyl group, and the foregoing groups optionally further have a substituent, but it is preferable that the foregoing groups dot not further have a substituent.

The constitutional unit represented by the formula (Y) includes, for example, constitutional units represented by the formula (Y-1) to the formula (Y-7) described later, and is preferably a constitutional unit represented by the formula (Y-1) or the formula (Y-2) from the standpoint of the luminance life of the light emitting device of the present embodiment, preferably a constitutional unit represented by the formula (Y-3) or the formula (Y-4) from the standpoint of electron transportability, preferably a constitutional unit represented by the formula (Y-5) to the formula (Y-7) from the standpoint of hole transportability.

[Chemical Formula 18]

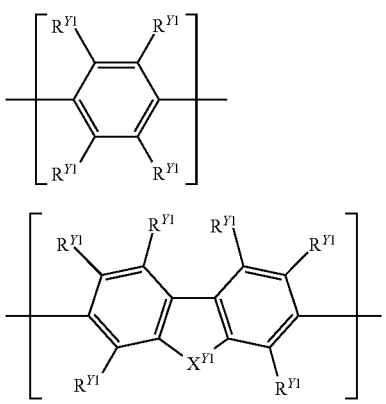

(Y-1)

(Y-2)

[wherein, $R^{Y1}$ represents a hydrogen atom, an alkyl group, a cycloalkyl group, an alkoxy group, a cycloalkoxy group, an aryl group or a monovalent heterocyclic group, and the foregoing groups optionally have a substituent. A plurality of $R^{Y1}$ may be the same or different, and may be combined together to form a ring together with carbon atoms to which they are attached.

$X^{Y1}$ represents a group represented by —$C(R^{Y2})_2$—, —$C(R^{Y2})$=$C(R^{Y2})$— or —$C(R^{Y2})_2$—$C(R^{Y2})_2$—. $R^{Y2}$ represents a hydrogen atom, an alkyl group, a cycloalkyl group, an alkoxy group, a cycloalkoxy group, an aryl group or a monovalent heterocyclic group, and the foregoing groups optionally have a substituent. A plurality of $R^{Y2}$ may be the same or different, and may be combined together to form a ring together with carbon atoms to which they are attached.]

$R^{Y1}$ is preferably a hydrogen atom, an alkyl group, a cycloalkyl group or an aryl group, and the foregoing groups optionally have a substituent.

$R^{Y2}$ is preferably an alkyl group, a cycloalkyl group, an aryl group or a monovalent heterocyclic group, more preferably an alkyl group, a cycloalkyl group or an aryl group, and the foregoing groups optionally have a substituent.

The examples and the preferable range of the substituent which $R^{Y1}$ and $R^{Y2}$ optionally have are the same as the examples and the preferable range of the substituent which the substituent which the group represented by $Ar^{Y1}$ optionally has optionally further has.

The combination of two groups $R^{Y2}$ in a group represented by —$C(R^{Y2})_2$— in $X^{Y1}$ is preferably a combination in which both are alkyl groups or cycloalkyl groups, both are aryl groups, both are monovalent heterocyclic groups, or one is an alkyl group or a cycloalkyl group and the other is an aryl group or a monovalent heterocyclic group, more preferably a combination in which one is an alkyl group or a cycloalkyl group and the other is an aryl group, and the foregoing groups optionally have a substituent. Two groups $R^{Y2}$ may be combined together to form a ring together with atoms to which they are attached, and when the groups $R^{Y2}$ form a ring, the group represented by —$C(R^{Y2})_2$— is preferably a group represented by the formula (Y-A1) to the formula (Y-A5), more preferably a group represented by the formula (Y-A4), and the foregoing groups optionally have a substituent.

[Chemical Formula 19]

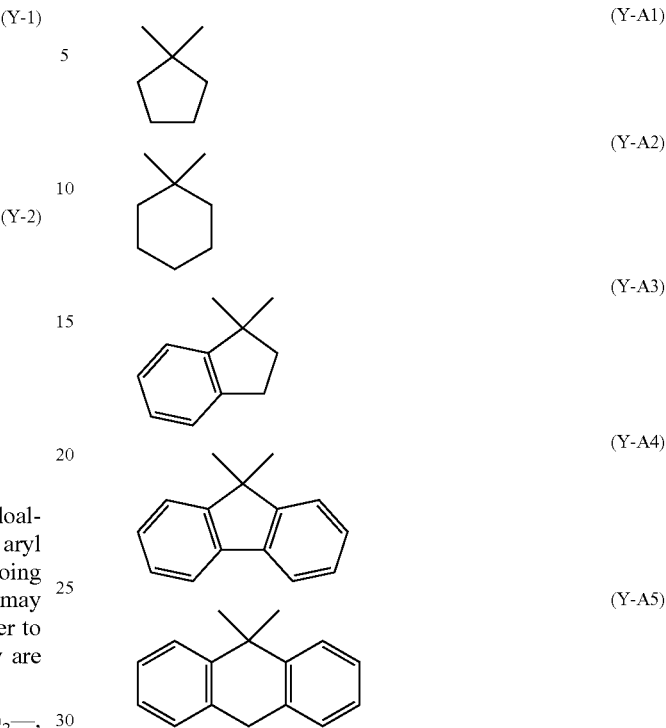

(Y-A1)

(Y-A2)

(Y-A3)

(Y-A4)

(Y-A5)

The combination of two groups $R^{Y2}$ in a group represented by —$C(R^{Y2})$=$C(R^{Y2})$— in $X^{Y1}$ is preferably a combination in which both are alkyl groups or cycloalkyl groups, or one is an alkyl group or a cycloalkyl group and the other is an aryl group, and the foregoing groups optionally have a substituent.

Four groups $R^{Y2}$ in a group represented by —$C(R^{Y2})_2$—$C(R^{Y2})_2$— in $X^{Y1}$ are each preferably an alkyl group or a cycloalkyl group optionally having a substituent. A plurality of $R^{Y2}$ may be combined together to form a ring together with atoms to which they are attached, and when the groups $R^{Y2}$ form a ring, the group represented by —$C(R^{Y2})_2$—$C(R^{Y2})_2$— is preferably a group represented by the formula (Y-B1) to the formula (Y-B5), more preferably a group represented by the formula (Y-B3), and the foregoing groups optionally have a substituent.

[Chemical Formula 20]

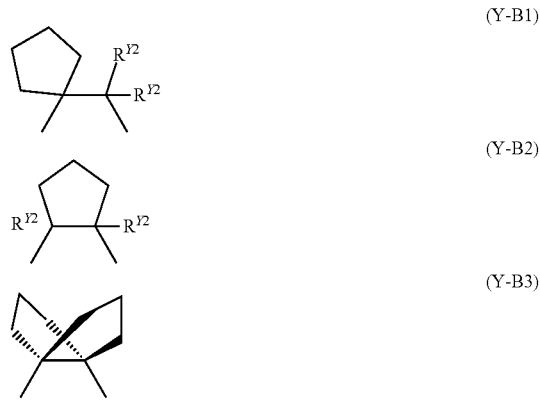

(Y-B1)

(Y-B2)

(Y-B3)

-continued

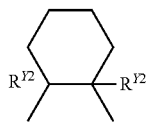
(Y-B4)

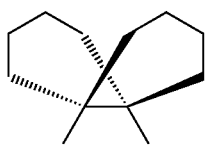
(Y-B5)

[wherein, $R^{Y2}$ represents the same meaning as described above.]

The constitutional unit represented by the formula (Y-1) is preferably a constitutional unit represented by the formula (Y-1'). The constitutional unit represented by the formula (Y-2) is preferably a constitutional unit represented by the formula (Y-2').

[Chemical Formula 21]

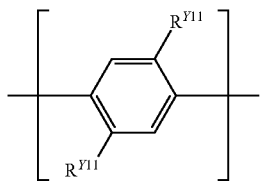
(Y-1')

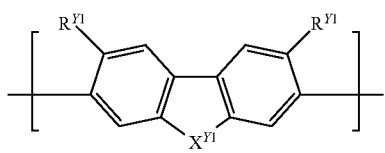
(Y-2')

[wherein, $R^{Y1}$ and $X^{Y1}$ represent the same meaning as described above. $R^{Y11}$ represents an alkyl group, a cycloalkyl group, an alkoxy group, a cycloalkoxy group, an aryl group or a monovalent heterocyclic group, and the foregoing groups optionally have a substituent. A plurality of $R^{Y11}$ may be the same or different.]

$R^{Y11}$ is preferably an alkyl group, a cycloalkyl group or an aryl group, more preferably an alkyl group or a cycloalkyl group, and the foregoing groups optionally have a substituent.

The examples and the preferable range of the substituent which $R^{Y11}$ optionally has are the same as the examples and the preferable range of the substituent which the substituent which the group represented by $Ar^{Y1}$ optionally has optionally further has.

[Chemical Formula 22]

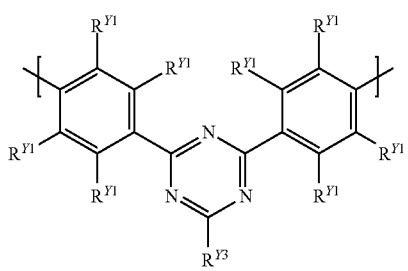
(Y-3)

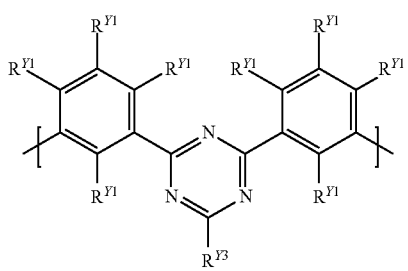
(Y-4)

[wherein, $R^{Y1}$ represents the same meaning as described above. $R^{Y3}$ represents a hydrogen atom, an alkyl group, a cycloalkyl group, an alkoxy group, a cycloalkoxy group, an aryl group or a monovalent heterocyclic group, and the foregoing groups optionally have a substituent.]

$R^{Y3}$ is preferably an alkyl group, a cycloalkyl group, an alkoxy group, a cycloalkoxy group, an aryl group or a monovalent heterocyclic group, more preferably an aryl group, and the foregoing groups optionally have a substituent.

The examples and the preferable range of the substituent which $R^{Y3}$ optionally has are the same as the examples and the preferable range of the substituent which the substituent which the group represented by $Ar^{Y1}$ optionally has optionally further has.

[Chemical Formula 23]

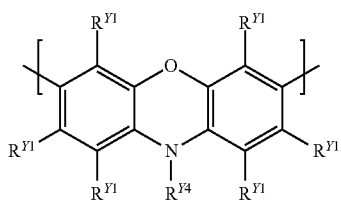
(Y-5)

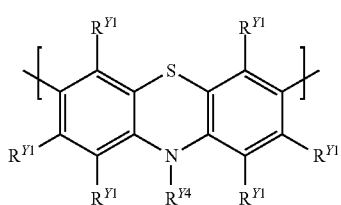
(Y-6)

(Y-7)

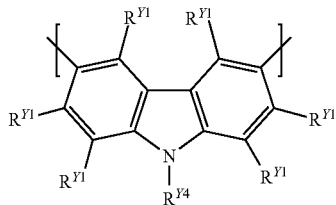

[wherein, $R^{Y1}$ represents the same meaning as described above. $R^{Y4}$ represents a hydrogen atom, an alkyl group, a cycloalkyl group, an alkoxy group, a cycloalkoxy group, an aryl group or a monovalent heterocyclic group, and the foregoing groups optionally have a substituent.]

$R^{Y4}$ is preferably an alkyl group, a cycloalkyl group, an alkoxy group, a cycloalkoxy group, an aryl group or a monovalent heterocyclic group, more preferably an aryl group, and the foregoing groups optionally have a substituent.

The examples and the preferable range of the substituent which $R^{Y4}$ optionally has are the same as the examples and the preferable range of the substituent which the substituent which the group represented by $Ar^{Y1}$ optionally has optionally further has.

The constitutional unit represented by the formula (Y) includes, for example, constitutional units represented by the formula (Y-11) to (Y-55).

[Chemical Formula 24]

(Y-11)

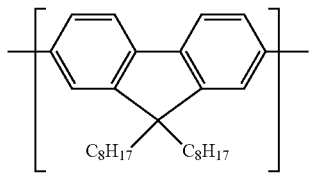

(Y-12)

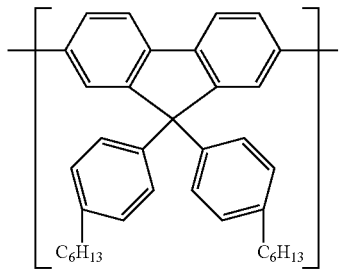

(Y-13)

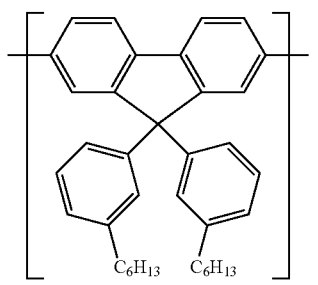

[Chemical Formula 25]

(Y-14)

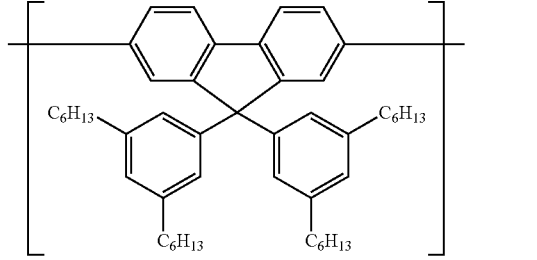

(Y-15)

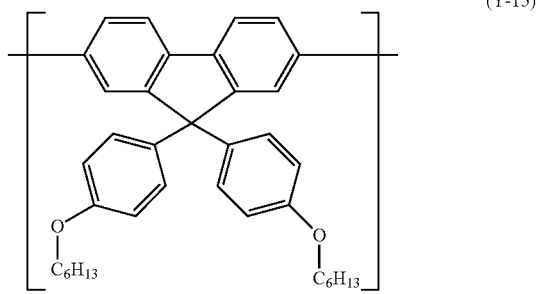

(Y-16)

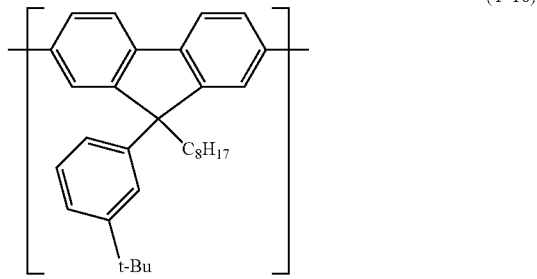

[Chemical Formula 26]

(Y-17)

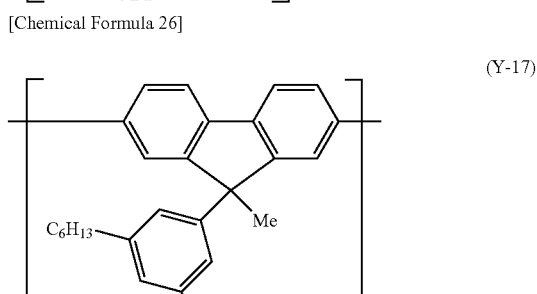

(Y-18)

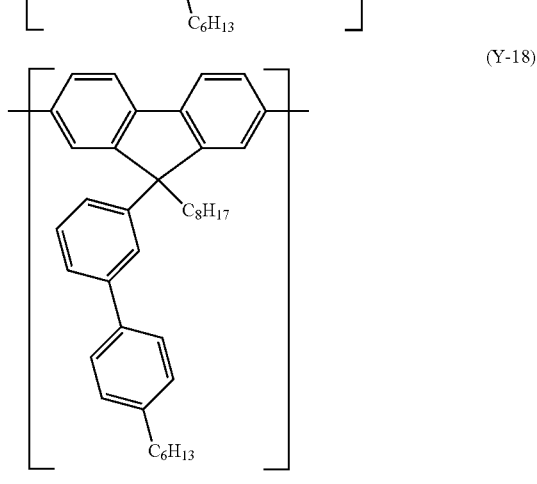

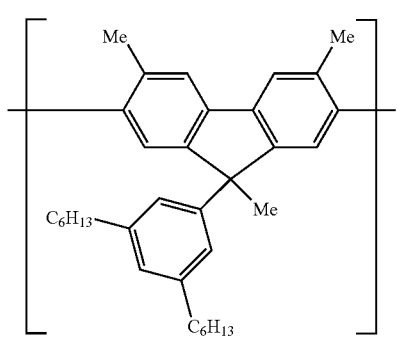
(Y-19)
[Chemical Formula 27]
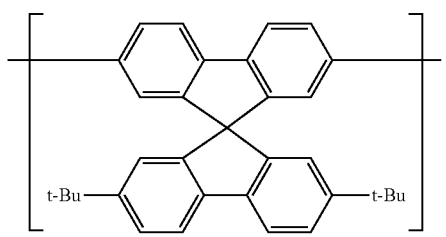
(Y-20)
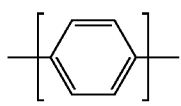
(Y-21)
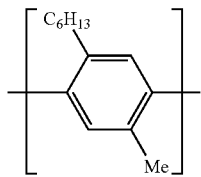
(Y-22)
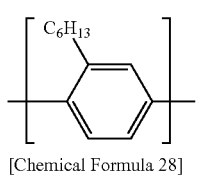
(Y-23)
[Chemical Formula 28]
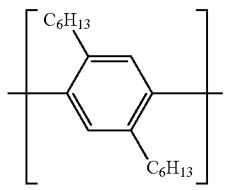
(Y-24)
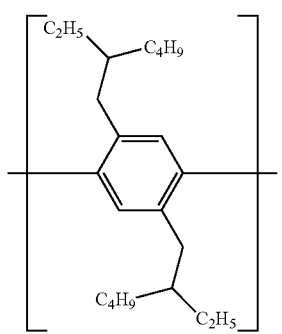
(Y-25)
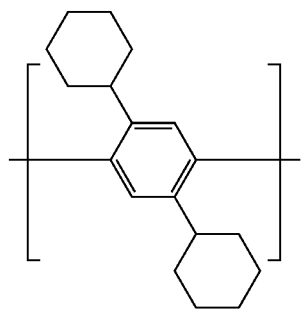
(Y-26)
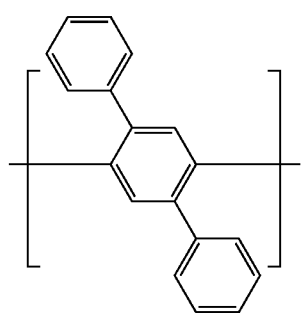
(Y-27)
[Chemical Formula 29]
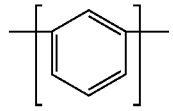
(Y-28)
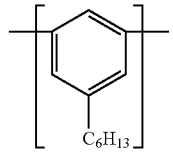
(Y-29)
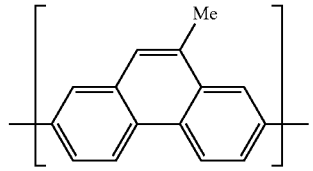
(Y-30)
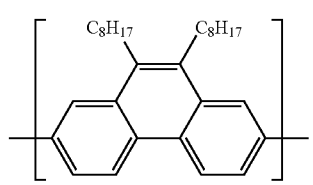
(Y-31)

[Chemical Formula 30]
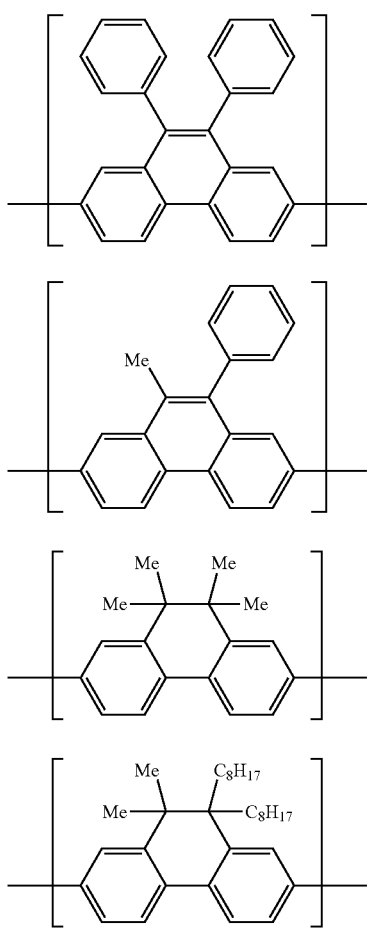
[Chemical Formula 31]
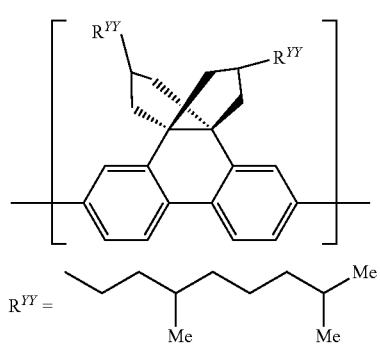
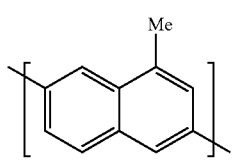
(Y-32)
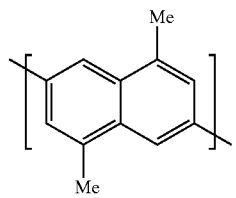
(Y-33)
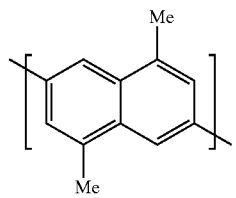
(Y-34)
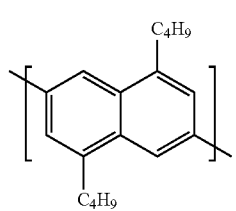
(Y-35)
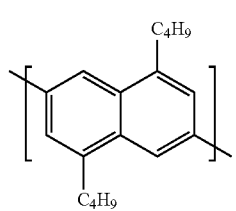
(Y-36)
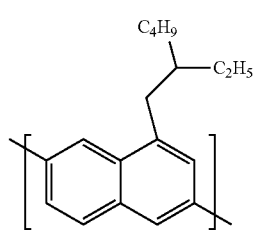
(Y-37)
(Y-38)
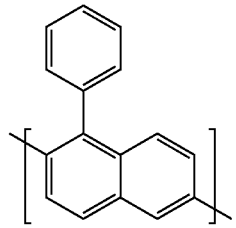
(Y-39)
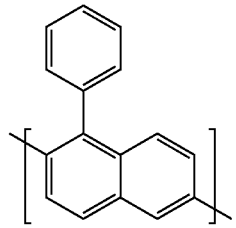
[Chemical Formula 32]
(Y-40)
(Y-41)
(Y-42)
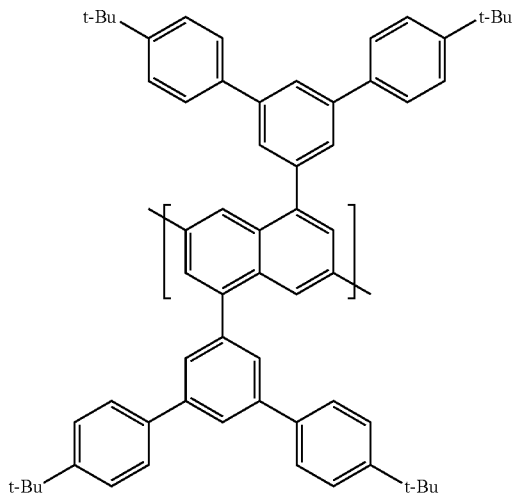

(Y-43) 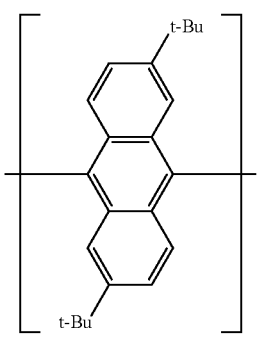
(Y-44) 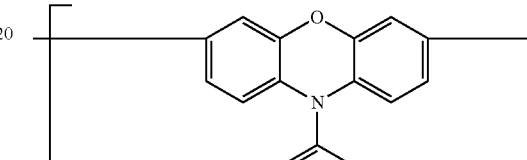
[Chemical Formula 33]
(Y-45) 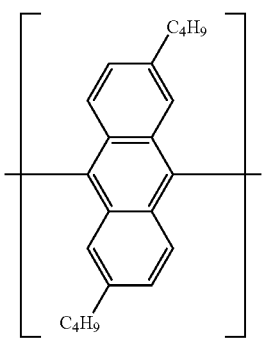
(Y-46) 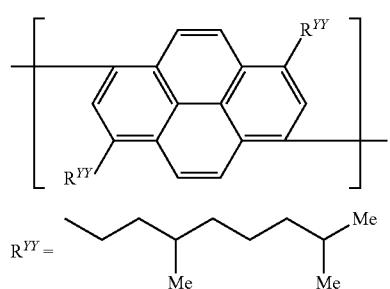
(Y-47) 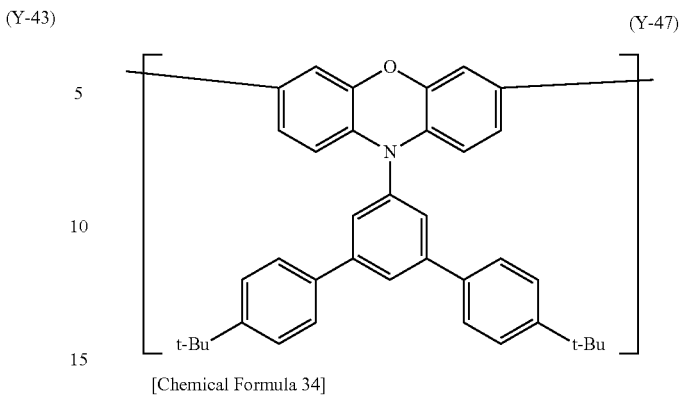
[Chemical Formula 34]
(Y-48) 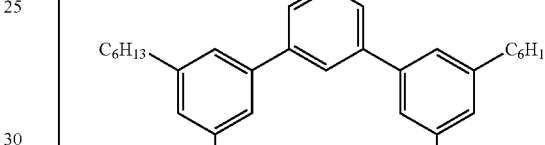
(Y-49)
[Chemical Formula 35]
(Y-50)

-continued (Y-51)
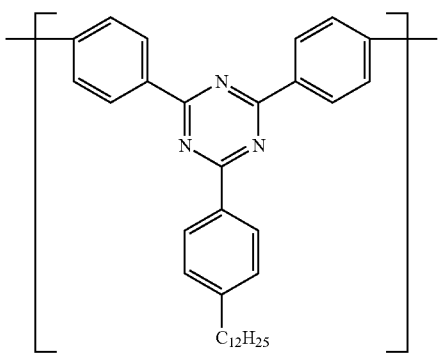

(Y-52)
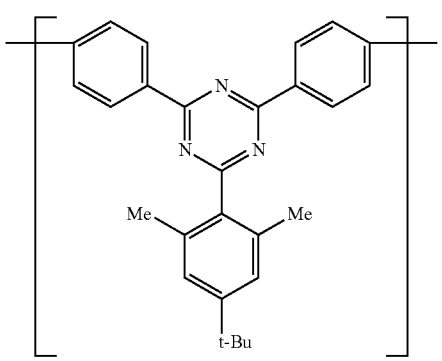

[Chemical Formula 36]

(Y-53)
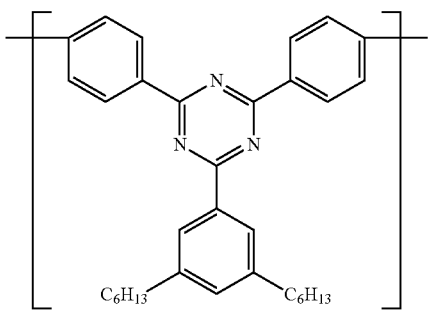

(Y-54)
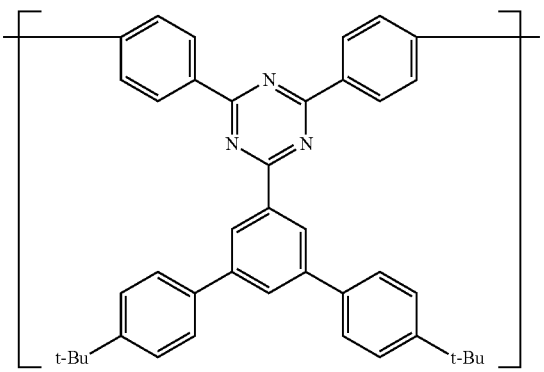

-continued (Y-55)
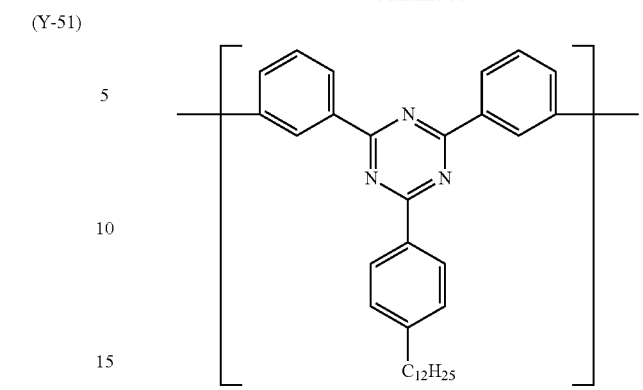

(2-2) Constitutional Unit Represented by the Formula (X)

The constitutional unit having no crosslinking group includes, for example, a constitutional unit represented by the formula (X).

[Chemical Formula 37]

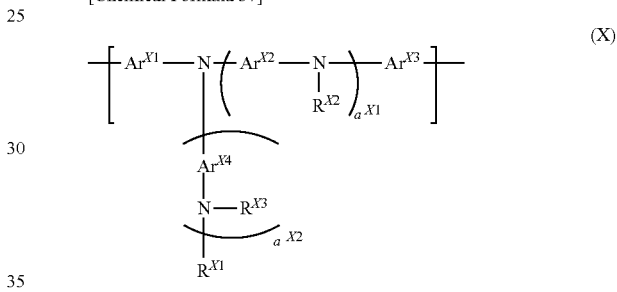

(X)

[wherein, $a^{X1}$ and $a^{X2}$ each independently represent an integer of 0 to 2.

$Ar^{X1}$ and $Ar^{X3}$ each independently represent an arylene group or a divalent heterocyclic group, and the foregoing groups optionally have a substituent.

$Ar^{X2}$ and $Ar^{X4}$ each independently represent an arylene group, a divalent heterocyclic group, or a divalent group in which at least one arylene group and at least one divalent heterocyclic group are bonded, and the foregoing groups optionally have a substituent. When a plurality of $Ar^{X2}$ and $Ar^{X4}$ are present, they may be the same or different at each occurrence.

$R^{X1}$, $R^{X2}$ and $R^{X3}$ each independently represent a hydrogen atom, an alkyl group, a cycloalkyl group, an aryl group or a monovalent heterocyclic group, and the foregoing groups optionally have a substituent. When a plurality of $R^{X2}$ and $R^{X3}$ are present, they may be the same or different at each occurrence.]

$a^{X1}$ is preferably 2 or less, more preferably 0 or 1, further preferably 1, since the light emitting device of the present embodiment is more excellent in luminance life.

$a^{X2}$ is preferably 2 or less, more preferably 0, since the light emitting device of the present embodiment is more excellent in luminance life.

$R^{X1}$, $R^{X2}$ and $R^{X3}$ are each preferably an alkyl group, a cycloalkyl group, an aryl group or a monovalent heterocyclic group, more preferably an aryl group, and the foregoing groups optionally have a substituent.

The examples and the preferable ranges of the arylene group and the divalent heterocyclic group represented by $Ar^{X1}$, $Ar^{X2}$, $Ar^{X3}$ and $Ar^{X4}$ are the same as the examples and the preferable ranges of the arylene group and the divalent heterocyclic group represented by $Ar^{Y1}$ in the formula (Y), respectively.

The examples and the preferable ranges of the arylene group and the divalent heterocyclic group in the divalent group in which at least one arylene group and at least one divalent heterocyclic group are bonded directly represented by $Ar^{X2}$ and $Ar^{X4}$ are the same as the examples and the preferable ranges of the arylene group and the divalent heterocyclic group represented by $Ar^{Y1}$ in the formula (Y), respectively.

The divalent group in which at least one arylene group and at least one divalent heterocyclic group are bonded directly represented by $Ar^{X2}$ and $Ar^{X4}$ includes the same groups as the divalent group in which at least one arylene group and at least one divalent heterocyclic group are bonded directly represented by $Ar^{Y1}$ in the formula (Y).

$Ar^{X1}$, $Ar^{X2}$, $Ar^{X3}$ and $Ar^{X4}$ are each preferably an arylene group optionally having a substituent.

The examples and the preferable range of the substituent which the group represented by $Ar^{X1}$ to $Ar^{X4}$ and $R^{X1}$ to $R^{X3}$ optionally has are the same as the examples and the preferable range of the substituent which the group represented by $Ar^{Y1}$ in the formula (Y) has.

The constitutional unit represented by the formula (X) includes, for example, constitutional units represented by the formula (X1-1) to the formula (X1-15).

[Chemical Formula 38]

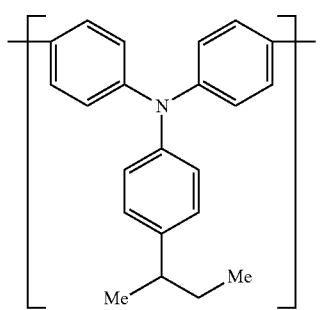
(X1-1)

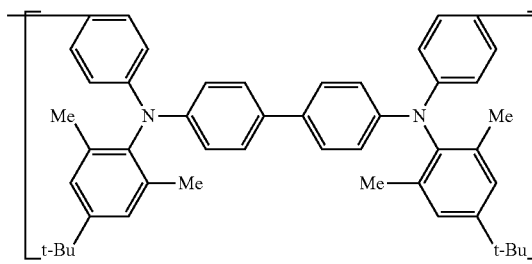
(X1-2)

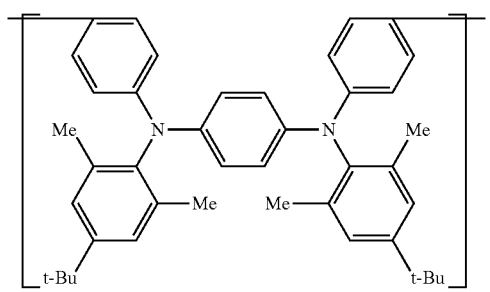
(X1-3)

[Chemical Formula 39]

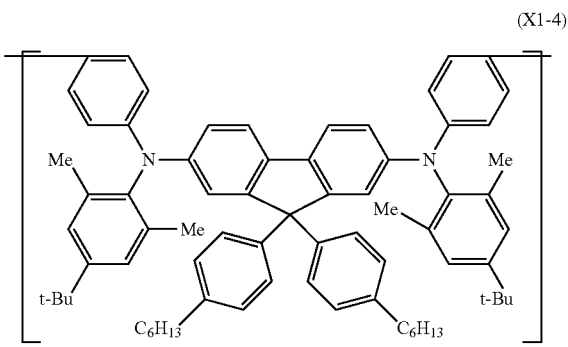
(X1-4)

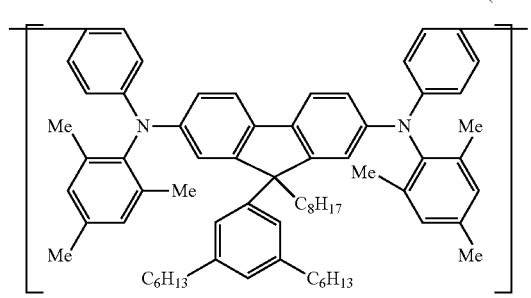
(X1-5)

[Chemical Formula 40]

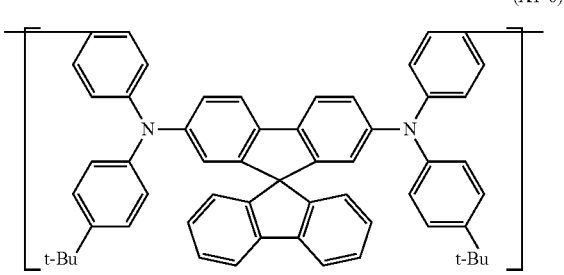
(X1-6)

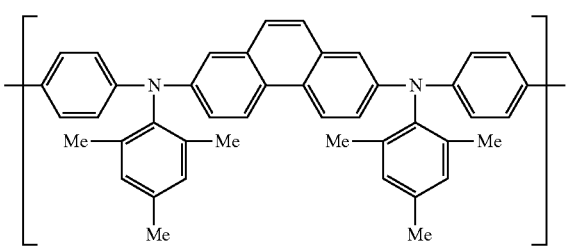
(X1-7)

[Chemical Formula 41]

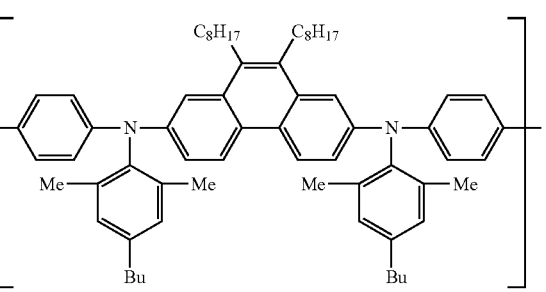
(X1-8)

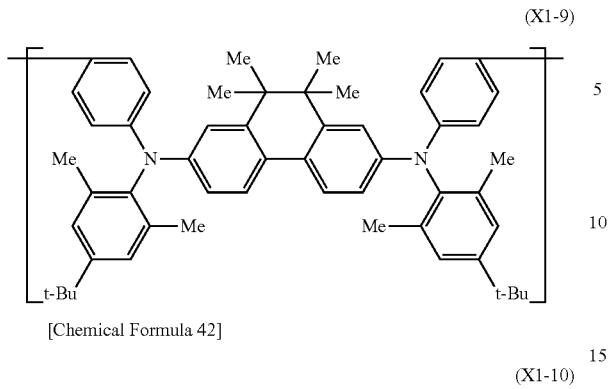

(X1-9)

[Chemical Formula 42]

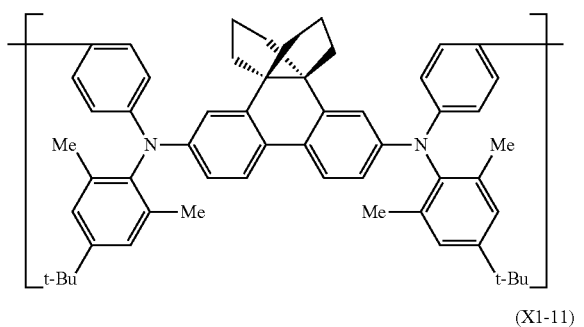

(X1-10)

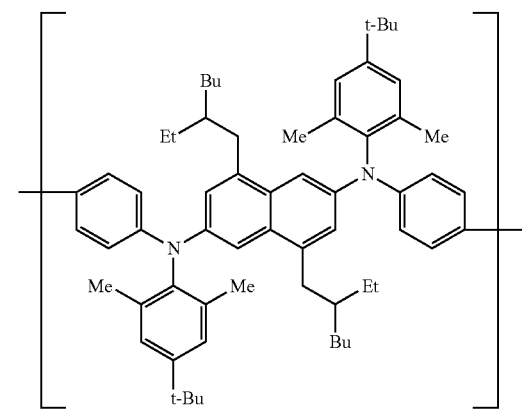

(X1-11)

[Chemical Formula 43]

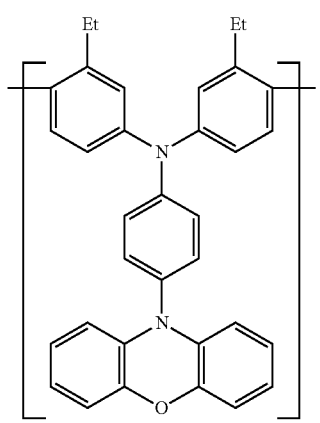

(X1-12)

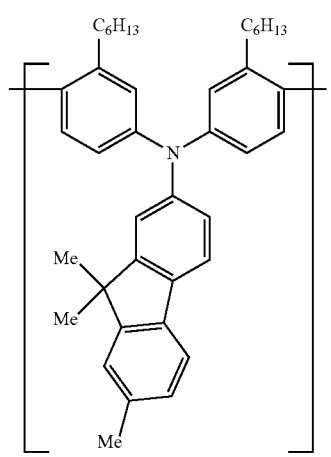

(X1-13)

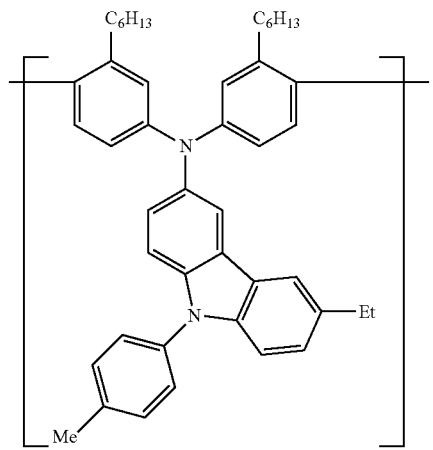

(X1-14)

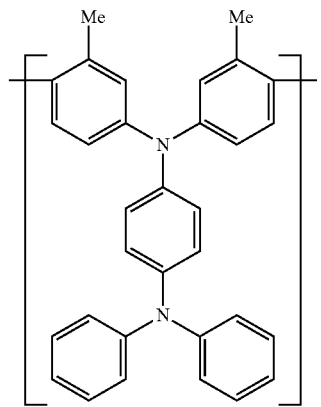

(X1-15)

(1-3) Constitutional Unit Represented by the Formula (Z)

nA is preferably an integer of 0 to 3, more preferably an integer of 0 to 2, since the light emitting device of the present embodiment is more excellent in luminance life.

n is preferably 1 or 2, more preferably 2, since the light emitting device of the present embodiment is more excellent in luminance life.

$Ar^3$ is preferably an aromatic hydrocarbon group optionally having a substituent, since the light emitting device of the present embodiment is more excellent in luminance life.

The number of carbon atoms of the aromatic hydrocarbon group represented by $Ar^3$ is usually 6 to 60, preferably 6 to 30, more preferably 6 to 18.

The examples and the preferable range of the arylene group portion obtained by removing n substituents of the aromatic hydrocarbon group represented by $Ar^3$ are the same as the examples and the preferable range of the arylene group represented by $Ar^{Y1}$ in the formula (Y).

The number of carbon atoms of the heterocyclic group represented by $Ar^3$ is usually 2 to 60, preferably 3 to 30, more preferably 4 to 18.

The examples and the preferable range of the divalent heterocyclic group portion obtained by removing n substituents of the heterocyclic group represented by $Ar^3$ are the same as the examples and the preferable range of the divalent heterocyclic group represented by $Ar^{Y1}$ in the formula (Y).

The examples and the preferable range of the substituent which the group represented by $Ar^3$ optionally has are the same as the examples and the preferable range of the substituent which the group represented by $Ar^{Y1}$ in the formula (Y) optionally has.

The number of carbon atoms of the alkylene group represented by $L^A$ is usually 1 to 20, preferably 1 to 15, more preferably 1 to 10. The number of carbon atoms of the cycloalkylene group represented by $L^A$ is usually 3 to 20.

The alkylene group and the cycloalkylene group optionally have a substituent, and for example, a methylene group, an ethylene group, a propylene group, a butylene group, a hexylene group, a cyclohexylene group and an octylene group, and these groups in which a hydrogen atom is substituted with an alkyl group, a cycloalkyl group, an alkoxy group, a cycloalkoxy group, an aryl group, a monovalent heterocyclic group, a fluorine atom and the like are preferable.

The examples and the preferable range of the arylene group represented by $L^A$ are the same as the examples and the preferable range of the arylene group represented by $Ar^{Y1}$ in the formula (Y), since the light emitting device of the present embodiment is more excellent in luminance life, and the arylene group represented by $L^A$ is preferably a phenylene group or a fluorenediyl group, more preferably a m-phenylene group, a p-phenylene group, a fluorene-2,7-diyl group or a fluorene-9,9-diyl group, and the foregoing groups optionally further have a substituent.

The examples and the preferable range of the divalent heterocyclic group represented by $L^A$ are the same as the examples and the preferable range of the divalent heterocyclic group represented by $Ar^{Y1}$ in the formula (Y).

$L^A$ is preferably an arylene group or an alkylene group, more preferably a phenylene group, a fluorenediyl group or an alkylene group, further preferably an alkylene group, and the foregoing groups optionally have a substituent, since production of the polymer compound of the present embodiment is easy.

The substituent which the group represented by $L^A$ optionally has is preferably an alkyl group, a cycloalkyl group, an alkoxy group, a cycloalkoxy group, an aryl group, a monovalent heterocyclic group, a substituted amino group, a fluorine atom, a cyano group or a crosslinking group selected from Group A of crosslinking group, more preferably an alkyl group, a cycloalkyl group, an alkoxy group, a cycloalkoxy group, an aryl group, a monovalent heterocyclic group or a crosslinking group selected from Group A of crosslinking group, further preferably an alkyl group, a cycloalkyl group, an aryl group or a monovalent heterocyclic group, particularly preferably an alkyl group, a cycloalkyl group or an aryl group, and the foregoing groups optionally further have a substituent.

X is preferably a crosslinking group represented by the formula (XL-1) to the formula (XL-4), the formula (XL-7) to the formula (XL-10) or the formula (XL-16) to the formula (XL-19), more preferably a crosslinking group represented by the formula (XL-1), the formula (XL-3), the formula (XL-9), the formula (XL-10), the formula (XL-16) to the formula (XL-19), further preferably a crosslinking group represented by the formula (XL-1), the formula (XL-16) to the formula (XL-19), particularly preferably a crosslinking group represented by the formula (XL-1) or the formula (XL-17), since the light emitting device of the present embodiment is more excellent in luminance life.

(1-4) Constitutional Unit Represented by the Formula (Z')

mA is preferably an integer of 0 to 3, more preferably an integer of 0 to 2, further preferably 0 or 1, particularly preferably 0, since the light emitting device of the present embodiment is more excellent in luminance life.

m is preferably 1 or 2, more preferably 2, since the light emitting device of the present embodiment is more excellent in luminance life.

c is preferably 0, since production of the polymer compound of the present embodiment is easy and since the light emitting device of the present embodiment is more excellent in luminance life.

$Ar^5$ is preferably an aromatic hydrocarbon group optionally having a substituent, since the light emitting device of the present embodiment is more excellent in luminance life.

The definition and the examples of the arylene group portion obtained by removing m substituents of the aromatic hydrocarbon group represented by $Ar^5$ are the same as the definition and the examples of the arylene group represented by $Ar^{X2}$ in the formula (X).

The definition and the examples of the divalent heterocyclic group portion obtained by removing m substituents of the heterocyclic group represented by $Ar^5$ are the same as the definition and the examples of the divalent heterocyclic group portion represented by $Ar^{X2}$ in the formula (X).

The definition and the examples of the divalent group obtained by removing m substituents of the group in which at least one aromatic hydrocarbon group and at least one heterocyclic group are bonded directly represented by $Ar^5$ are the same as the definition and the examples of the divalent group in which at least one arylene group and at least one divalent heterocyclic group are bonded directly represented by $Ar^{X2}$ in the formula (X).

$Ar^4$ and $Ar^6$ are each preferably an arylene group optionally having a substituent, since the light emitting device of the present embodiment is more excellent in luminance life.

The definition and the examples of the arylene group represented by $Ar^4$ and $Ar^6$ are the same as the definition and the examples of the arylene group represented by $Ar^{X1}$ and $Ar^{X3}$ in the formula (X).

The definition and the examples of the divalent heterocyclic group represented by $Ar^4$ and $Ar^6$ are the same as the definition and the examples of the divalent heterocyclic group represented by $Ar^{X1}$ and $Ar^{X3}$ in the formula (X).

The examples and the preferable range of the substituent which the group represented by $Ar^4$ to $Ar^6$ optionally has are the same as the examples and the preferable range of the substituent which the group represented by $Ar^{Y1}$ in the formula (Y) optionally has.

The definition and the examples of the alkylene group, the cycloalkylene group, the arylene group and the divalent heterocyclic group represented by $K^A$ are the same as the definition and the examples of the alkylene group, the cycloalkylene group, the arylene group and the divalent heterocyclic group represented by $L^A$ in the formula (Z), respectively.

$K^A$ is preferably an arylene group or an alkylene group, more preferably, phenylene group, a fluorenediyl group or an alkylene group, further preferably phenylene group or a methylene group, and the foregoing groups optionally have a substituent, since production of the polymer compound of the second organic layer is easy.

The examples and the preferable range of the substituent which the group represented by $K^A$ optionally has are the same as the examples and the preferable range of the substituent which the group represented by $L^A$ in the formula (Z) optionally has.

The definition and the examples of the crosslinking group represented by X' are the same as the definition and the examples of X in the formula (Z) described above.

The constitutional unit having a crosslinking group includes, for example, constitutional units represented by the following formulae.

[Chemical Formula 44]

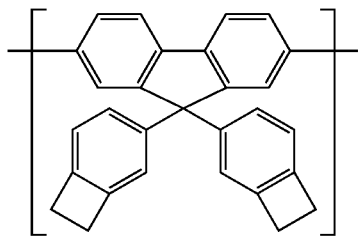
(3-1)

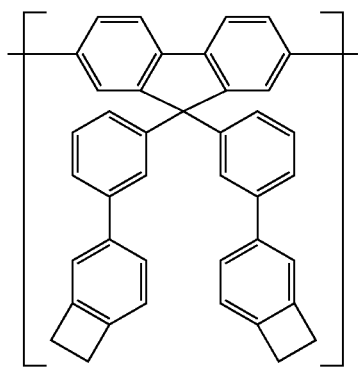
(3-2)

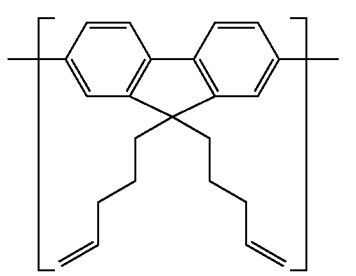
(3-3)

-continued

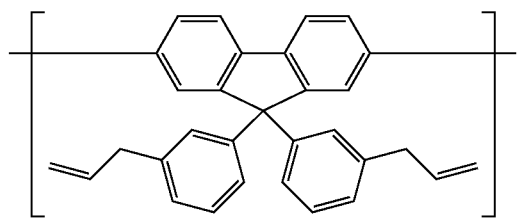
(3-4)

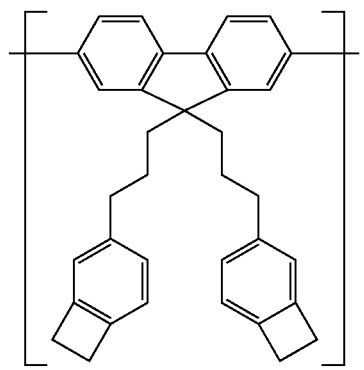
(3-5)

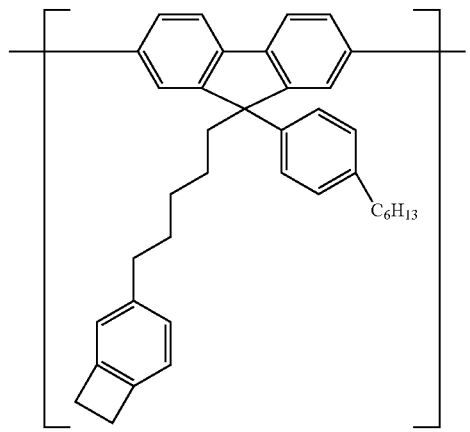
(3-11)

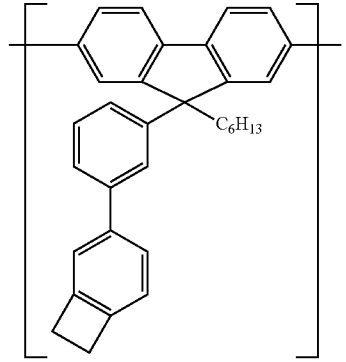
(3-12)

(3-13)
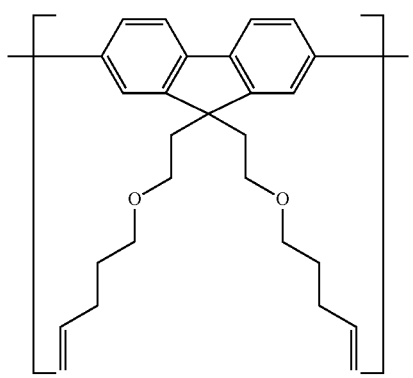
(3-14)
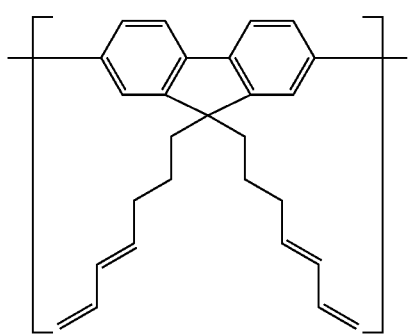
(3-15)
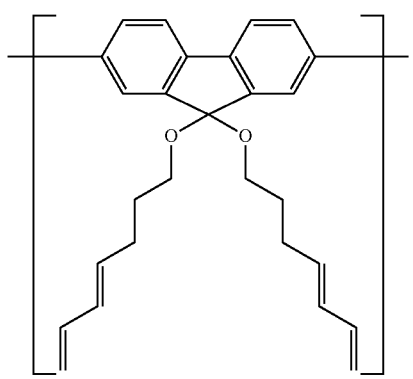
(3-1)
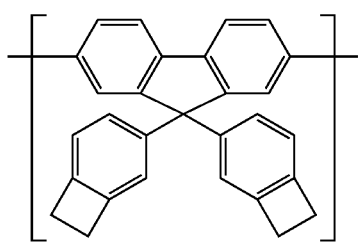
(3-2)
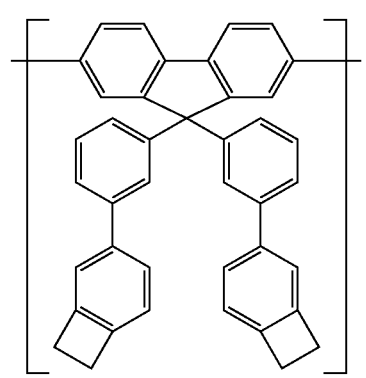
(3-3)
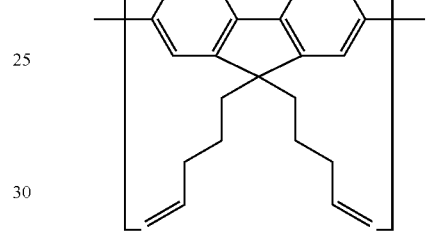
(3-4)
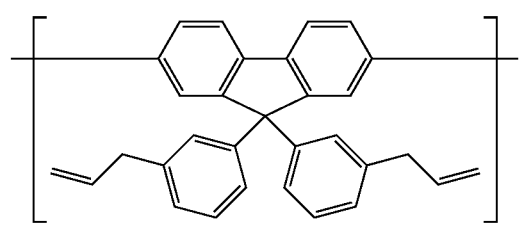
(3-5)

(3-6)
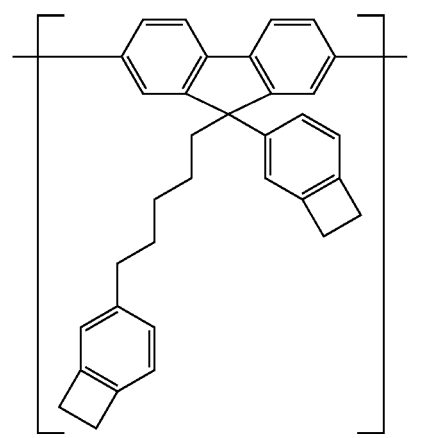
(3-7)
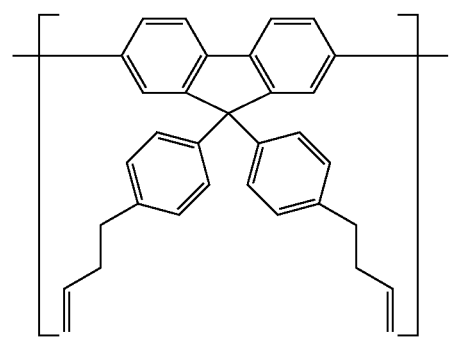
(3-8)
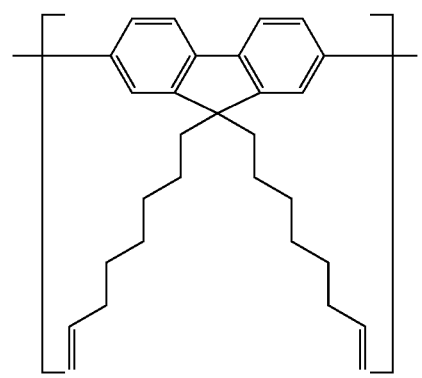
(3-9)
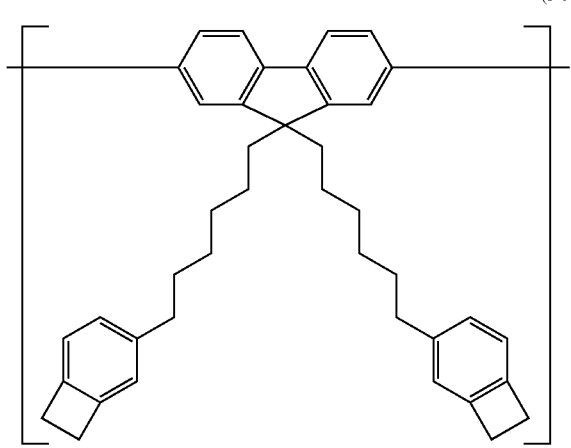
(3-10)
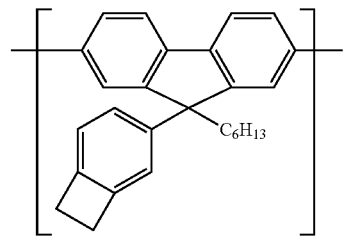
(3-11)
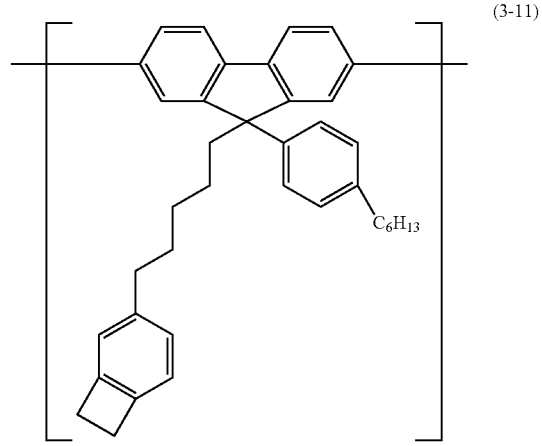
(3-12)
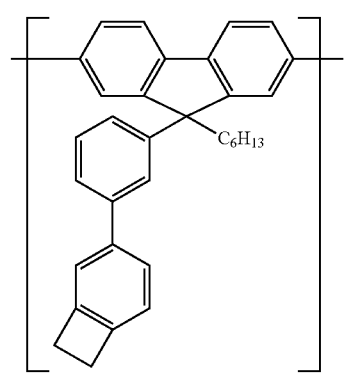
(3-13)
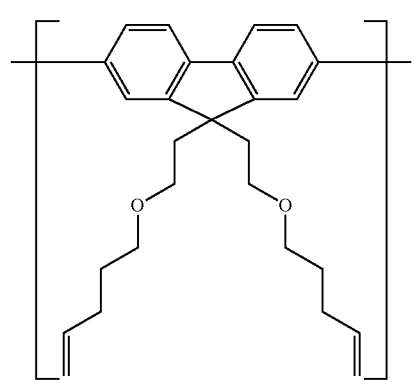

(3-14)
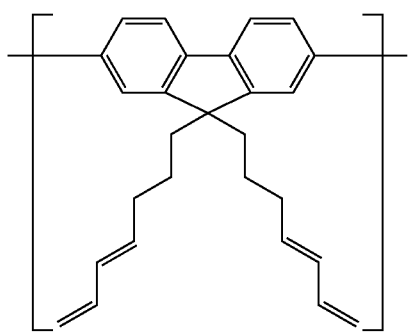
(3-18)
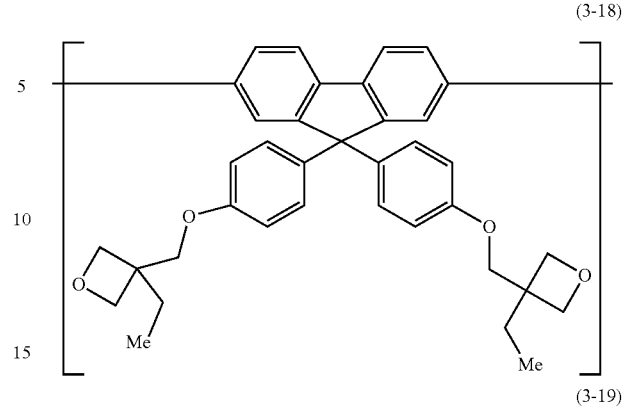
(3-15)
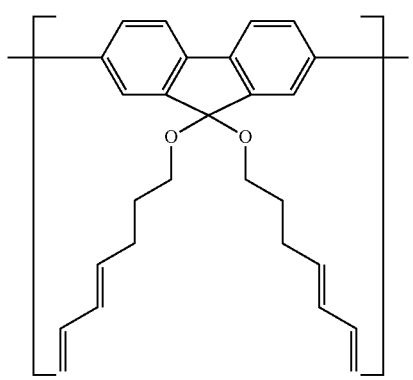
(3-19)
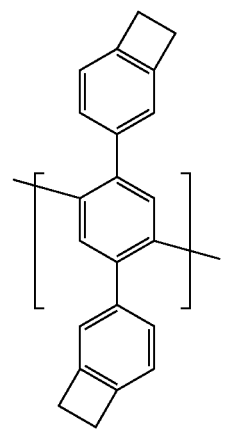
[Chemical Formula 45]
(3-16)
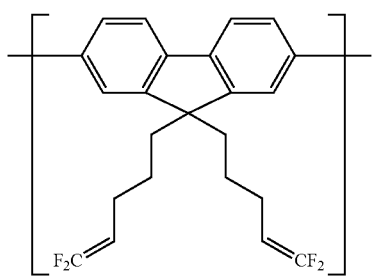
(3-20)
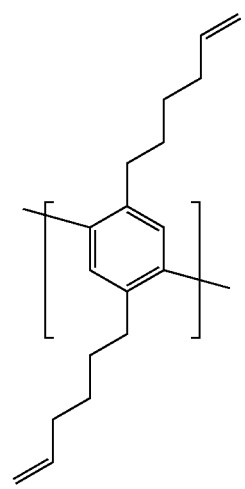
(3-17)
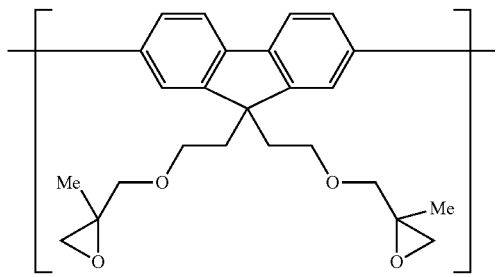
(3-27)
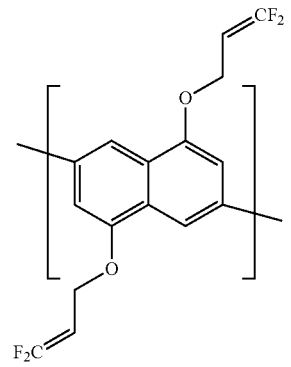

(3-28)
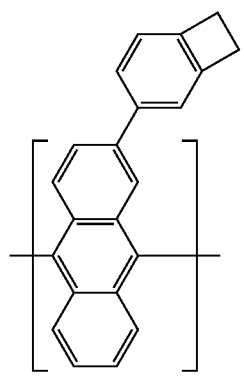
(3-18)
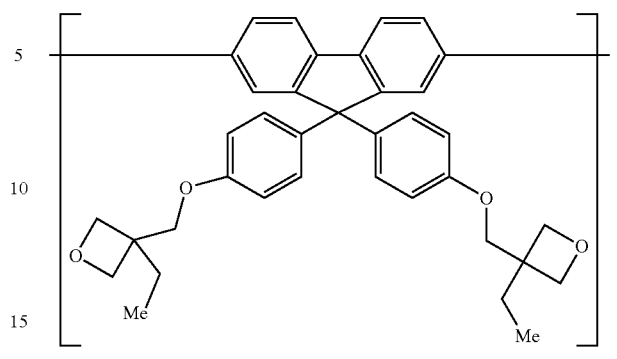
(3-29)
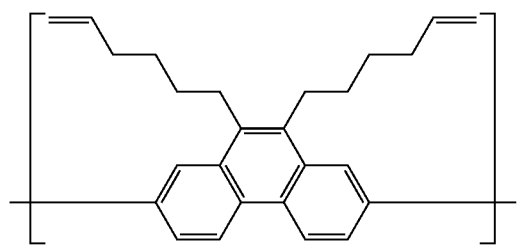
(3-19)
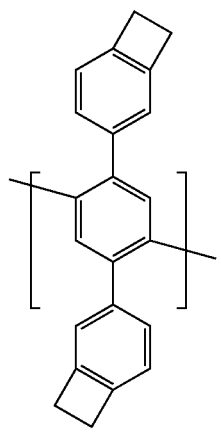
(3-30)
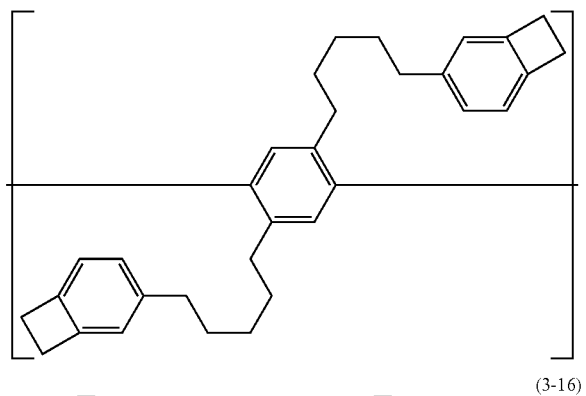
(3-20)
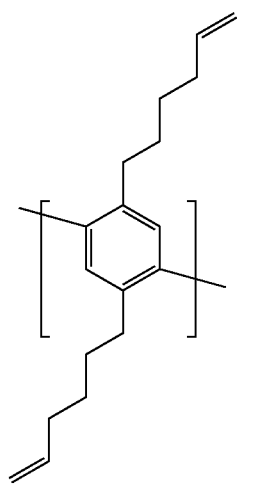
(3-16)
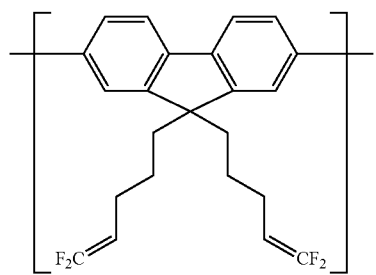
(3-17)
(3-21)
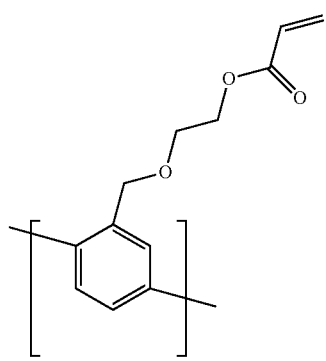

(3-22)
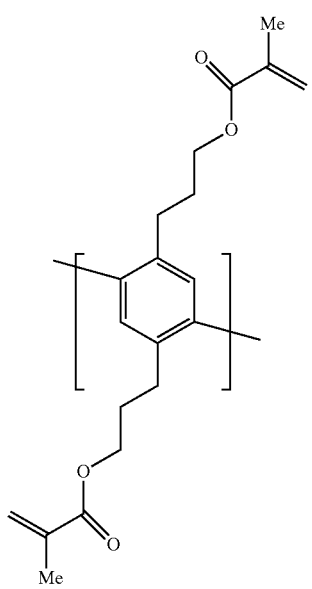
(3-24)
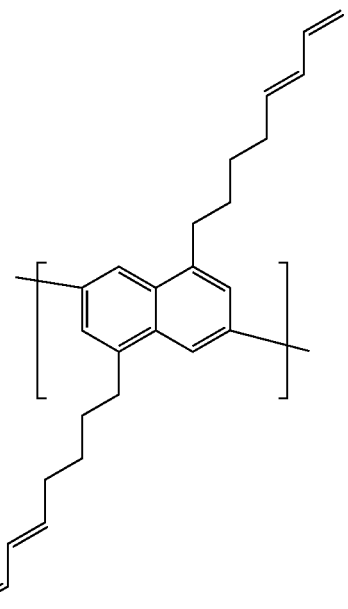
(3-23)
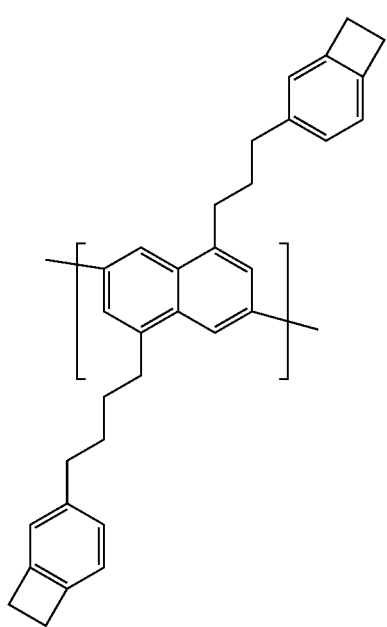
(3-25)
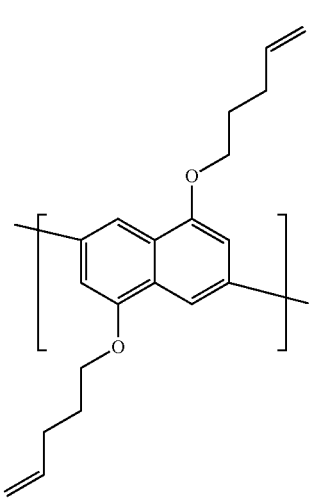

-continued
(3-26)
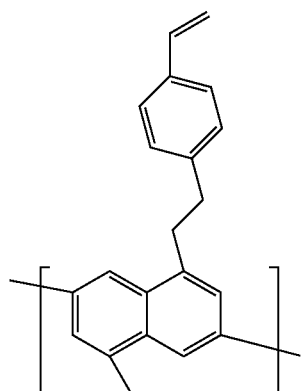
(3-27)
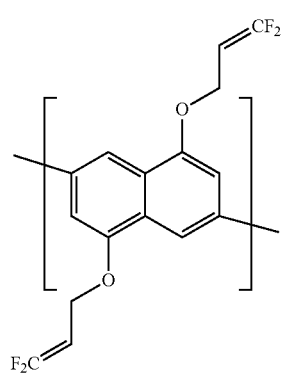
(3-28)
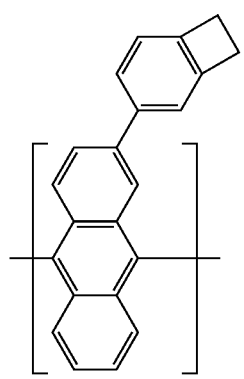
(3-29)
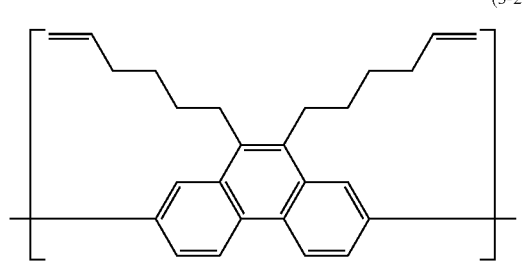
-continued
(3-30)
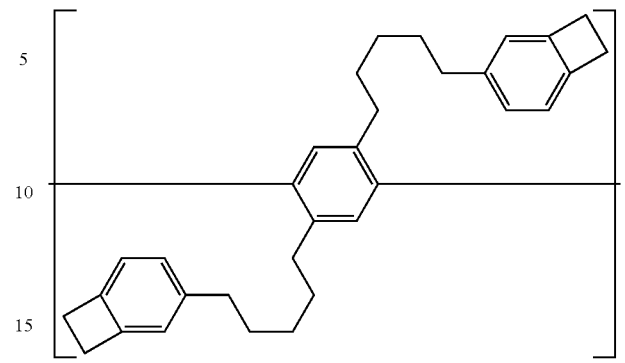
[Chemical Formula 46]
(4-1)
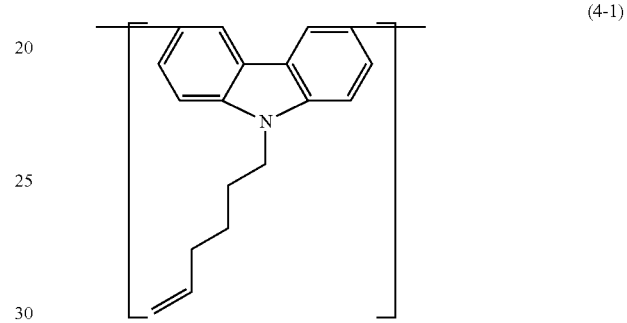
(4-2)
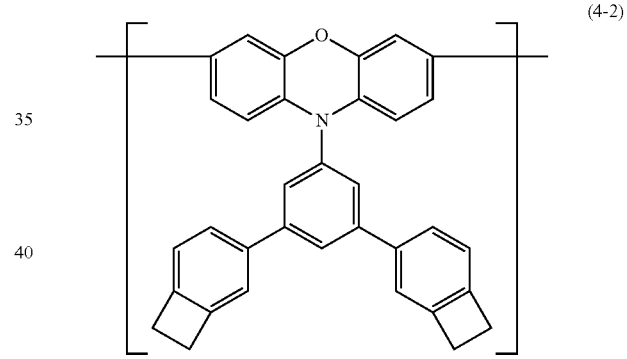
(4-3)
(4-4)
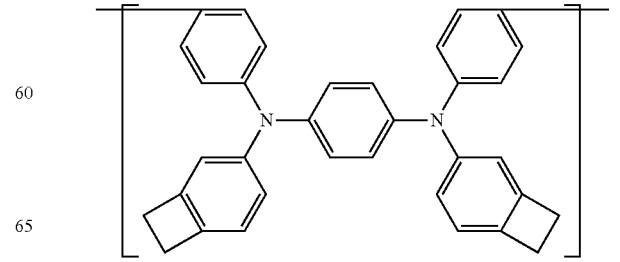

(4-5)
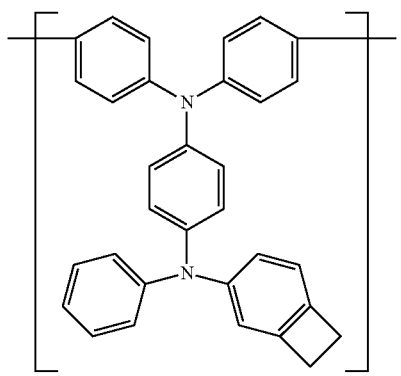
(4-3)
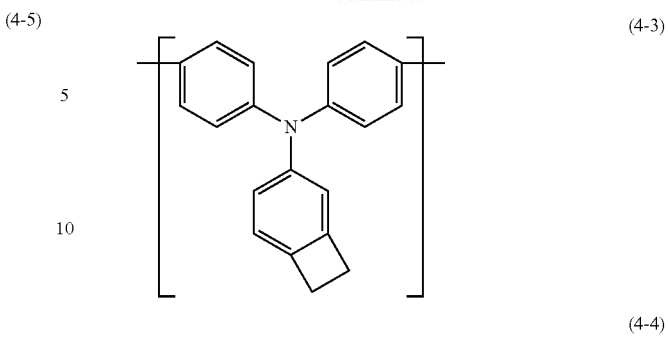
(4-9)
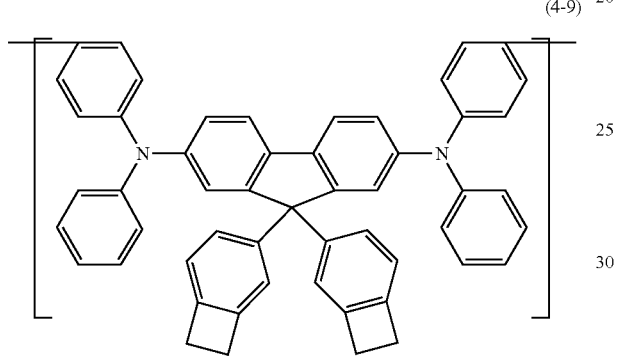
(4-4)
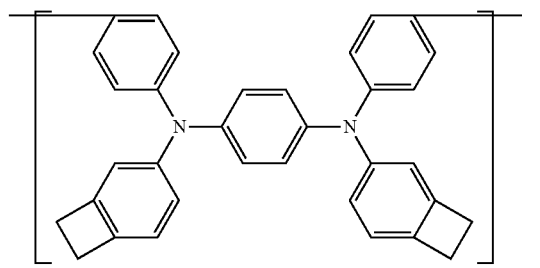
(4-5)
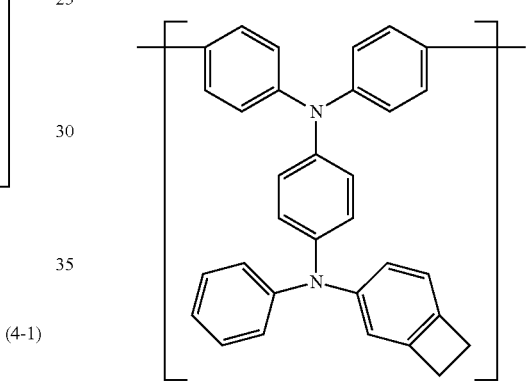
(4-1)
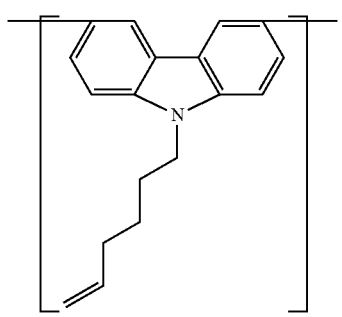
(4-6)
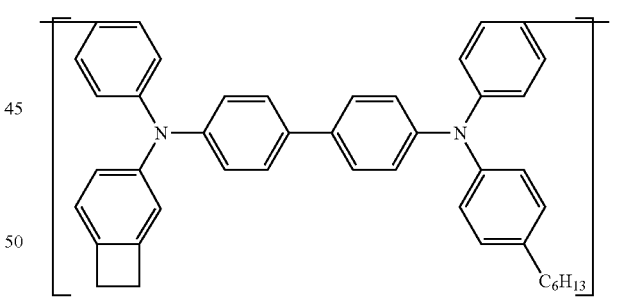
(4-2)
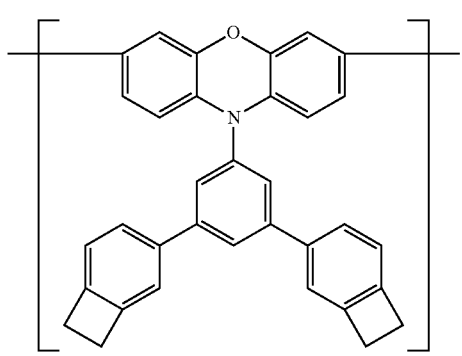
(4-7)
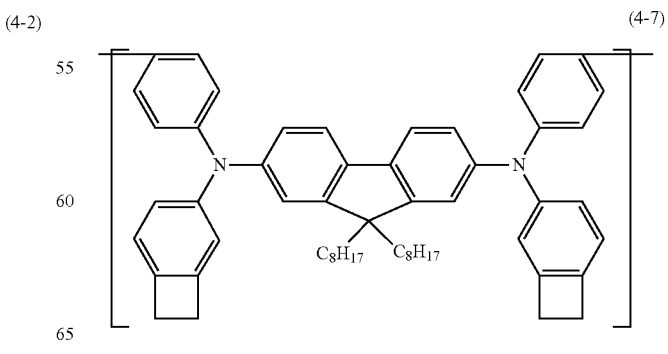

-continued (4-8)

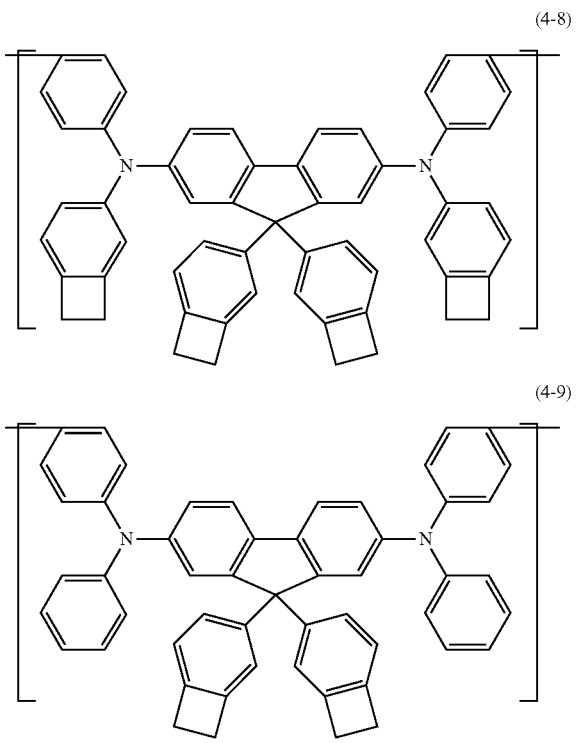

(4-9)

[Chemical Formula 47]

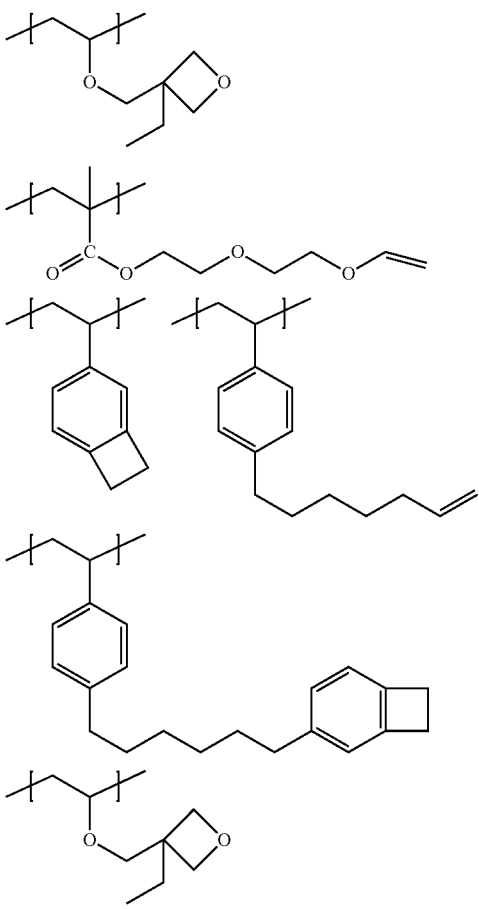

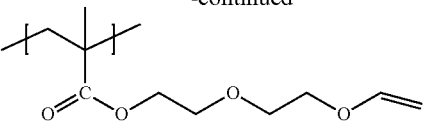

(1-5) Production Method of Polymer Compound Containing Constitutional Unit Having Crosslinking Group The polymer compound containing a constitutional unit having a crosslinking group can be produced using known polymerization methods described in Chemical Review (Chem. Rev.), vol. 109, pp. 897 to 1091 (2009) and the like. For example, methods of polymerizing by a coupling reaction using a transition metal catalyst such as the Suzuki reaction, the Yamamoto reaction, the Buchwald reaction, the Stille reaction, the Negishi reaction, the Kumada reaction and the like are mentioned.

In the above-described polymerization methods, the method of charging monomers includes a method in which the entire monomers are charged all at once into the reaction system, a method in which a part of the monomers is charged and reacted, then, the remaining monomers are charged all at once, continuously or in a divided manner, a method of charging monomers continuously or dividedly, and other methods.

The transition metal catalyst includes a palladium catalyst, a nickel catalyst and the like.

For the post treatment of the polymerization reaction, known methods can be used. For example, a method in which water-soluble impurities are removed by liquid separation, a method in which a reaction solution after the polymerization reaction is added to a lower alcohol such as methanol and the like, the deposited precipitate is filtrated, then, dried, and other methods can be conducted each singly or used in combination of two or more. When the purity of the polymer compound containing a constitutional unit having a crosslinking group is low, for example, it can be purified by usual methods such as recrystallization, reprecipitation, continuous extraction with a Soxhlet extractor, column chromatography and the like.

(2) Low Molecular Weight Compound Having Crosslinking Group

The low molecular weight compound having a crosslinking group is preferably a low molecular weight compound represented by the formula (Z").

$m^{B1}$ is usually an integer of 0 to 10, and it is preferably an integer of 0 to 5, more preferably an integer of 0 to 2, further preferably 0 or 1, particularly preferably 0, since synthesis of a low molecular weight compound having a crosslinking group is easy.

$m^{B2}$ is usually an integer of 0 to 10, and it is preferably an integer of 0 to 5, more preferably an integer of 0 to 3, further preferably 1 or 2, particularly preferably 1, since synthesis of a low molecular weight compound having a crosslinking group is easy and since the light emitting device of the present embodiment is more excellent in luminance life.

$m^{B3}$ is usually an integer of 0 to 5, and it is preferably an integer of 0 to 4, more preferably an integer of 0 to 2, further preferably 0, since synthesis of a low molecular weight compound having a crosslinking group is easy.

The definition and the examples of the arylene group portion obtained by removing $m^{B3}$ substituents of the aromatic hydrocarbon group represented by $Ar^7$ are the same as the definition and the examples of the arylene group represented by $Ar^{X2}$ in the formula (X).

The definition and the examples of the divalent heterocyclic group portion obtained by removing $m^{B3}$ substituents of the heterocyclic group represented by $Ar^7$ are the same as the definition and the examples of the divalent heterocyclic group portion represented by $Ar^{X2}$ in the formula (X).

The definition and the examples of the divalent group obtained by removing $m^{B3}$ substituents of the group in which at least one aromatic hydrocarbon group and at least one heterocyclic group are bonded directly represented by $Ar^7$ are the same as the definition and the examples of the divalent group in which an arylene group and a divalent heterocyclic group are bonded directly represented by $Ar^{X2}$ in the formula (X).

The definition and the examples of the substituent which the group represented by $Ar^7$ optionally has are the same as the definition and the examples of the substituent which the group represented by $Ar^{X2}$ in the formula (X) optionally has.

$Ar^7$ is preferably an aromatic hydrocarbon group, and the foregoing aromatic hydrocarbon group optionally has a substituent, since the light emitting device of the present embodiment is more excellent in luminance life.

The definition and the examples of the alkylene group, the cycloalkylene group, the arylene group and the divalent heterocyclic group represented by $L^{B1}$ are the same as the definition and the examples of the alkylene group, the cycloalkylene group, the arylene group and the divalent heterocyclic group represented by $L^A$ in the formula (Z), respectively.

$L^{B1}$ is preferably an alkylene group, an arylene group or an oxygen atom, more preferably an alkylene group or an arylene group, further preferably phenylene group, a fluorenediyl group or an alkylene group, particularly preferably phenylene group or an alkylene group, and the foregoing groups optionally have a substituent, since synthesis of a low molecular weight compound having a crosslinking group is easy.

X" is preferably a crosslinking group represented by any of the formula (XL-1) to the formula (XL-19), an aryl group or a monovalent heterocyclic group, more preferably a crosslinking group represented by the formula (XL-1), the formula (XL-3), the formula (XL-7) to the formula (XL-10) or the formula (XL-16) to the formula (XL-19), or an aryl group, further preferably a crosslinking group represented by the formula (XL-1) or the formula (XL-16) to the formula (XL-19), a phenyl group, a naphthyl group or a fluorenyl group, particularly preferably a crosslinking group represented by the formula (XL-16) or the formula (XL-17), a phenyl group or a naphthyl group, especially preferably a crosslinking group represented by the formula (XL-16) or a naphthyl group, and the foregoing groups optionally have a substituent.

The low molecular weight compound having a crosslinking group includes, for example, low molecular weight compounds represented by the formula (3-1) to the formula (3-16).

[Chemical Formula 48]

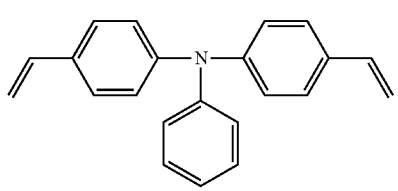
(3-1)

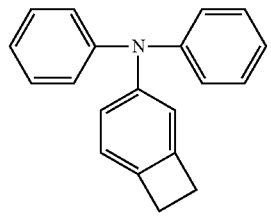
(3-2)

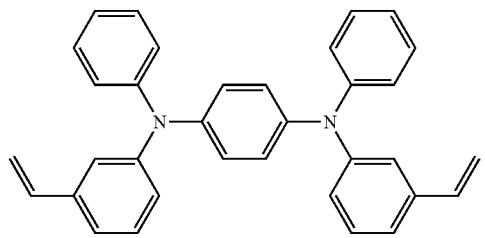
(3-3)

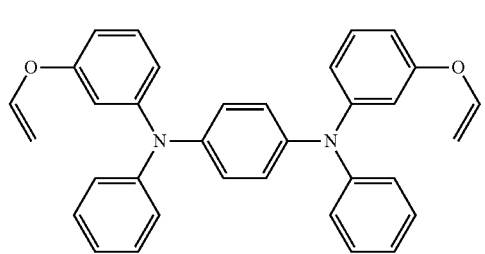
(3-4)

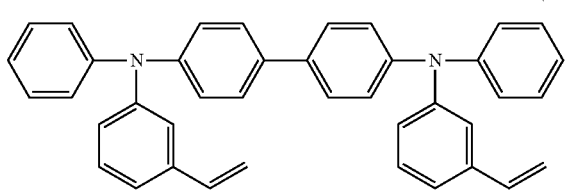
(3-5)

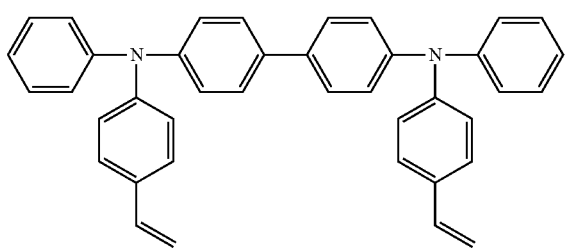
(3-6)

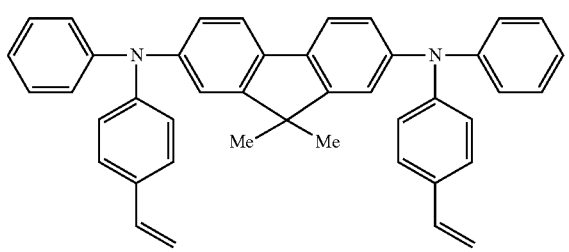
(3-7)

(3-8)
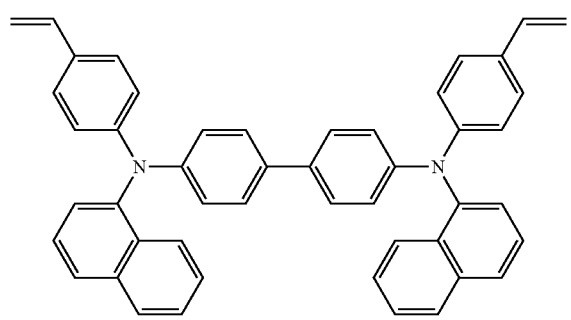
(3-12)
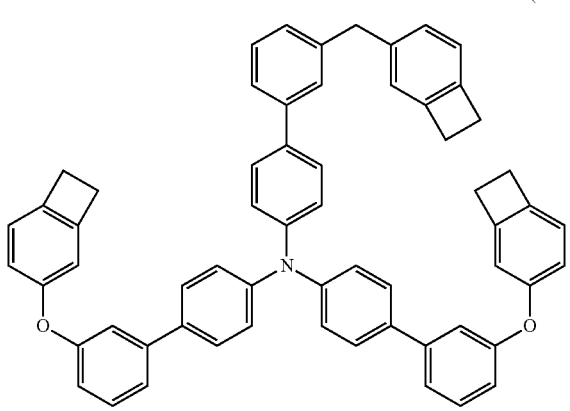
(3-9)
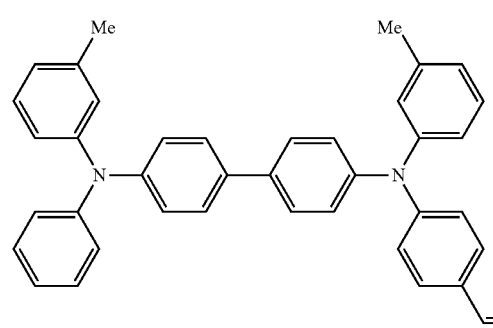
(3-13)
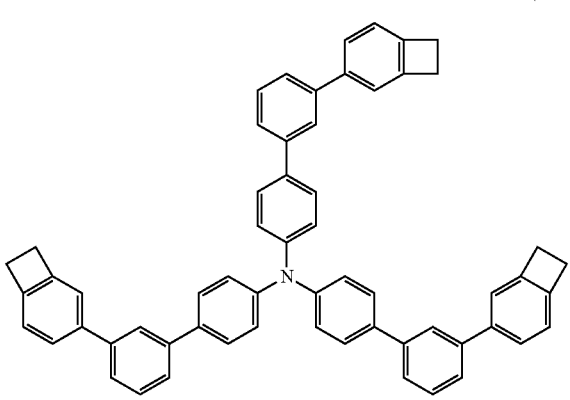
(3-10)
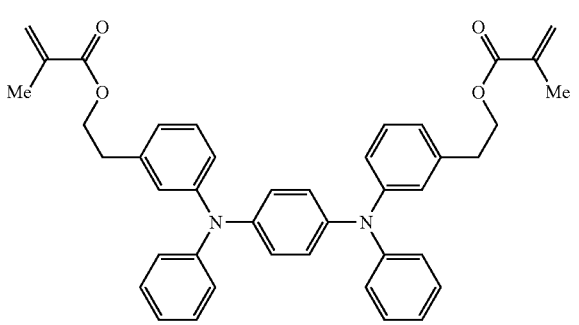
[Chemical Formula 49]
(3-11)
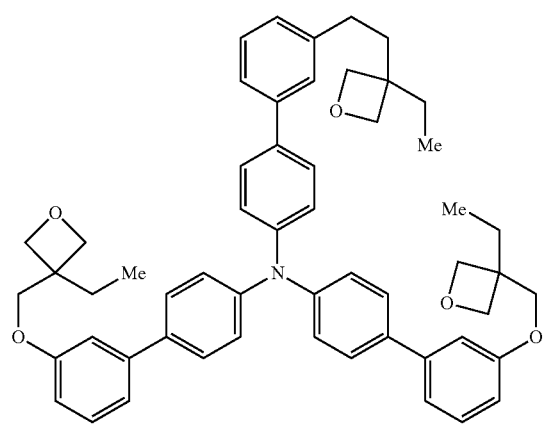
(3-14)
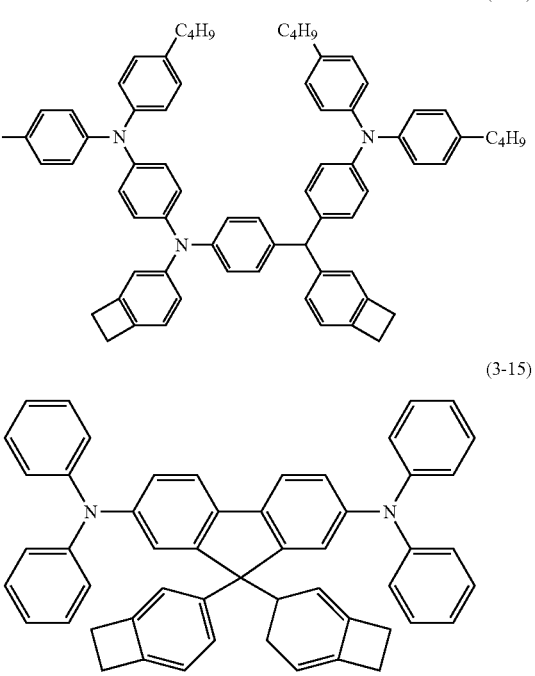
(3-15)

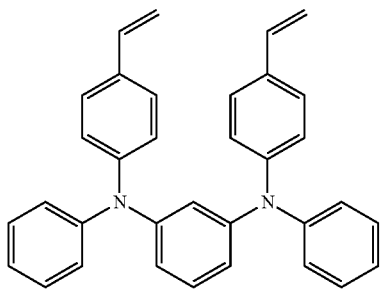

(3-16)

The low molecular weight compound having a crosslinking group is available, for example, from Aldrich, Luminescence Technology Corp., American Dye Source and the like. Additionally, it can be synthesized according to methods described, for example, in International Publication WO1997/033193, International Publication WO2005/035221 and International Publication WO2005/049548.

2.3 Other Material which can be Contained in Film for Light Emitting Device

The film for light emitting device of the present invention contains the above-described cross-linked body having a crosslinking group and if necessary, may contain other materials. The other material includes, for example, a hole transporting material, a hole injection material, an electron transporting material, an electron injection material, a light emitting material and an antioxidant. The film for light emitting device may further contain at least one material selected from the group consisting of them. When film for light emitting device contains the cross-linked body having a crosslinking group and other materials, the film for light emitting device can be fabricated, for example, by cross-linking a crosslinkable material having a crosslinking group to produce a cross-linked body having a crosslinking group, then, mixing other materials, or by mixing a crosslinkable material having a crosslinking group with other materials, then, crosslinking the mixture.

[Hole Transporting Material]

The hole transporting material is classified into low molecular weight compounds and polymer compounds, and polymer compounds having a crosslinking group are preferable.

The polymer compound includes, for example, polyvinylcarbazoles and derivatives thereof; polyarylenes having an aromatic amine structure in the side chain or main chain and derivatives thereof. The polymer compound may also be a compound in which an electron accepting site is bonded such as fullerene, tetrafluorotetracyanoquinodimethane, tetracyanoethylene, trinitrofluorenone and the like.

In the film for light emitting device of the present invention, the compounding amount of the hole transporting material is usually 1 to 400 parts by mass when the amount of the cross-linked body having a crosslinking group is taken as 100 parts by mass. The hole transporting material may be used singly or in combination of two or more.

[Electron Transporting Material]

The electron transporting material is classified into low molecular weight compounds and polymer compounds. The electron transporting material may have a crosslinking group.

The low molecular weight compound includes, for example, metal complexes having 8-hydroxyquinoline as a ligand; oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene, and derivatives thereof. The polymer compound may be doped with a metal.

In the film for light emitting device of the present invention, the compounding amount of the electron transporting material is usually 1 to 400 parts by mass when the amount of the cross-linked body having a crosslinking group is taken as 100 parts by mass. The electron transporting material may be used singly or in combination of two or more.

[Hole Injection Material and Electron Injection Material]

The hole injection material and the electron injection material are each classified into low molecular weight compounds and polymer compounds. The hole injection material and the electron injection material may have a crosslinking group.

The low molecular weight compound includes, for example, metal phthalocyanines such as copper phthalocyanine and the like; carbon; oxides of metals such as molybdenum, tungsten and the like; and metal fluorides such as lithium fluoride, sodium fluoride, cesium fluoride, potassium fluoride and the like.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as polymers containing an aromatic amine structure in the main chain or side chain, and the like.

In the film for light emitting device of the present invention, the compounding amounts of the hole injection material and the electron injection material are each usually 1 to 400 parts by mass when the amount of the cross-linked body having a crosslinking group is taken as 100 parts by mass. The hole injection material and the electron injection material each may be used singly or in combination of two or more.

[Ion Doping]

When the hole injection material or the electron injection material contains an electrically conductive polymer, the electric conductivity of the electrically conductive polymer is preferably $1\times10^{-5}$ S/cm to $1\times10^{3}$ S/cm. For adjusting the electric conductivity of the electrically conductive polymer within such a range, the electrically conductive polymer can be doped with an appropriate amount of ions. The kind of the ion to be doped is an anion for the hole injection material and a cation for the electron injection material. The anion includes, for example, a polystyrenesulfonic ion, an alkylbenzenesulfonic ion and a camphor sulfonic ion. The cation includes, for example, a lithium ion, a sodium ion, a potassium ion and a tetrabutylammonium ion. The ion to be doped may be used singly or in combination of two or more.

[Light Emitting Material]

The light emitting material is classified into low molecular weight compounds and polymer compounds. The light emitting material may have a crosslinking group.

The low molecular weight compound includes, for example, naphthalene and derivatives thereof, anthracene and derivatives thereof, perylene and derivatives thereof, and triplet light emitting complexes containing iridium, platinum or europium as the central metal.

The polymer compound includes, for example, polymer compounds containing an arylene group such as a phenylene group, a naphthalenediyl group, a fluorenediyl group, a phenanthrenediyl group, a dihydrophenanthrenediyl group, an anthracenediyl group, a pyrenediyl group and the like; an aromatic amine residue such as a group obtained by removing from an aromatic amine two hydrogen atoms, and the like; and a divalent heterocyclic group such as a carbazolediyl group, a phenoxazinediyl group, a phenothiazinediyl group and the like.

The triplet light emitting complex includes, for example, metal complexes shown below.

[Chemical Formula 50]

Ir(ppy)₃

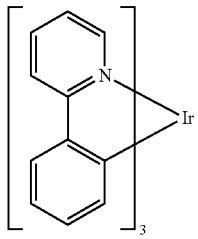

Btp₂Ir(acac)

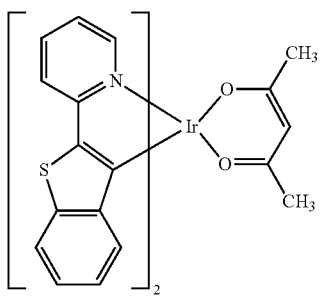

FIrpic

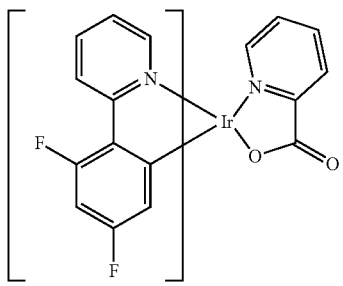

PtOEP

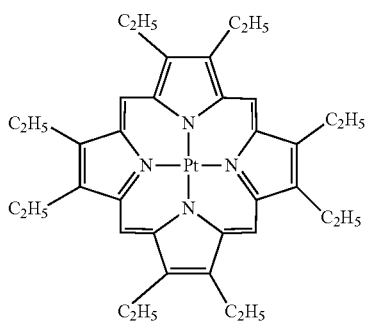

EU(TTA)₃phen

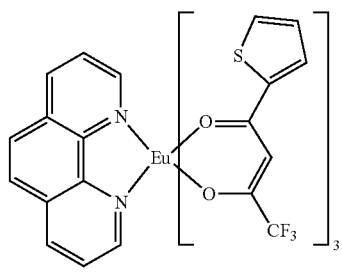

[Chemical Formula 51]

COM-1

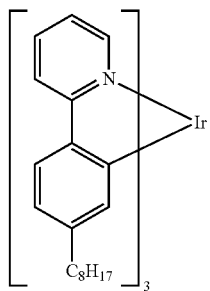

COM-2

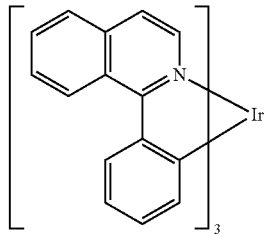

COM-3

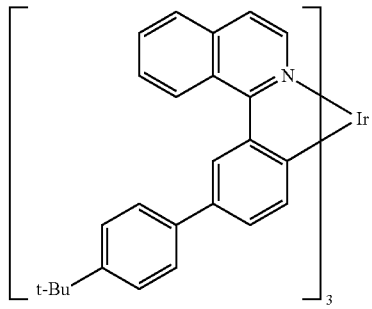

-continued
COM-4
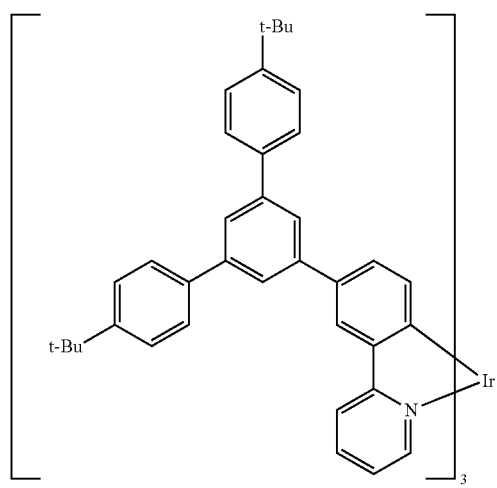
COM-5
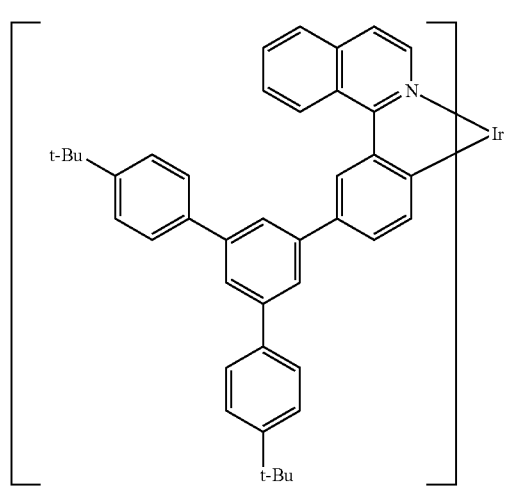
[Chemical Formula 52]
COM-6
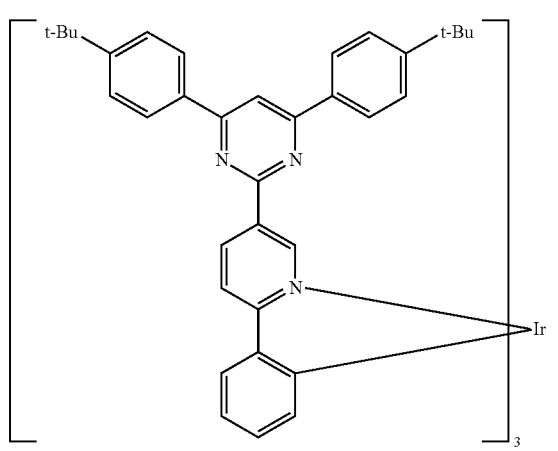
-continued
COM-7
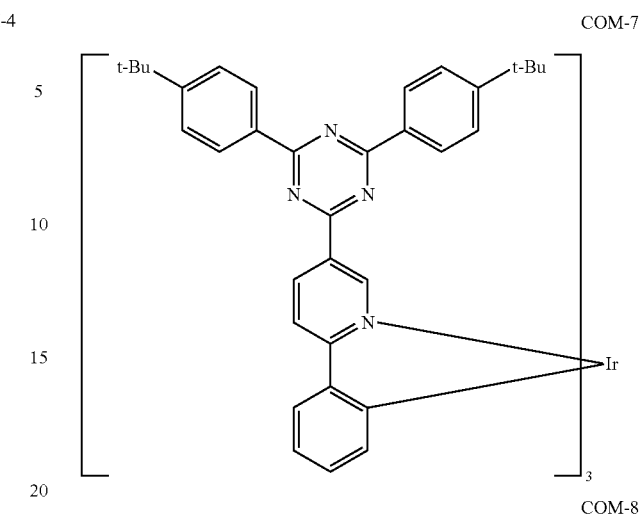
COM-8
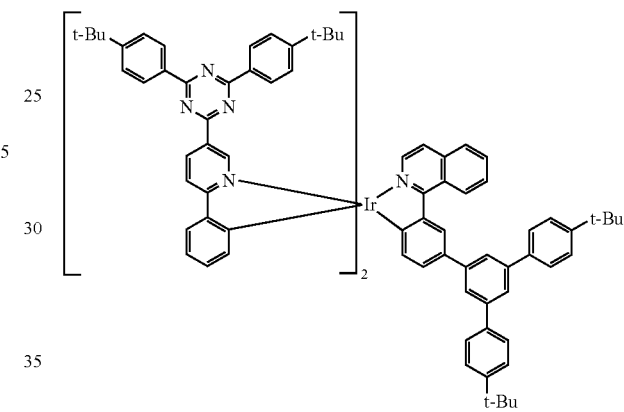
[Chemical Formula 53]
COM-14
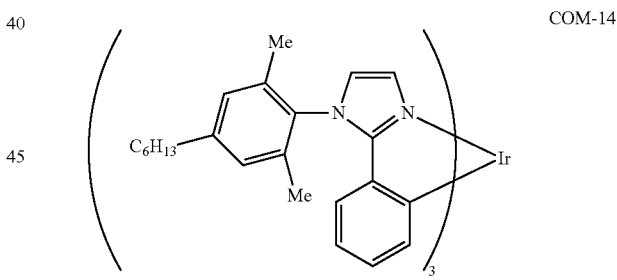
COM-15
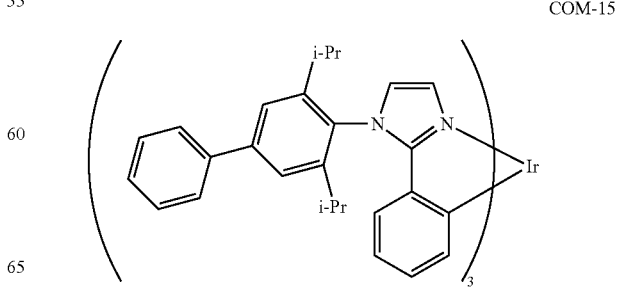

-continued

COM-16

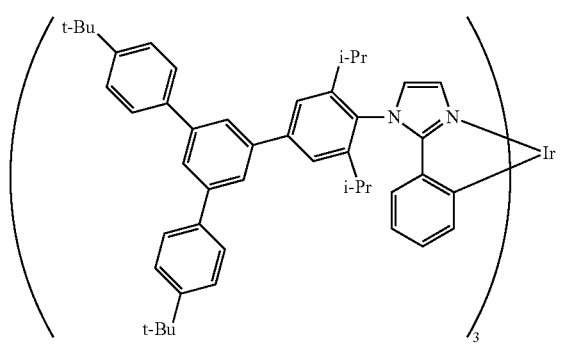

[Chemical Formula 54]

COM-17

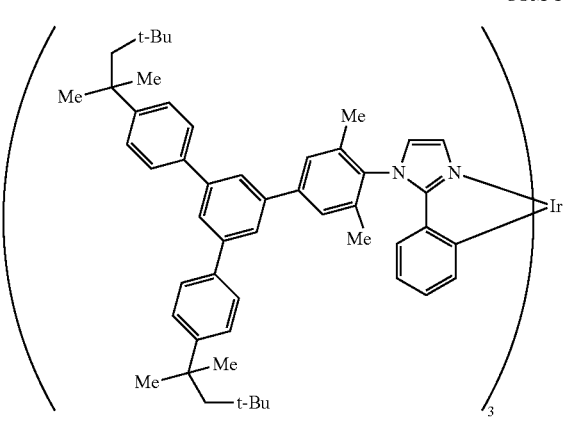

COM-18

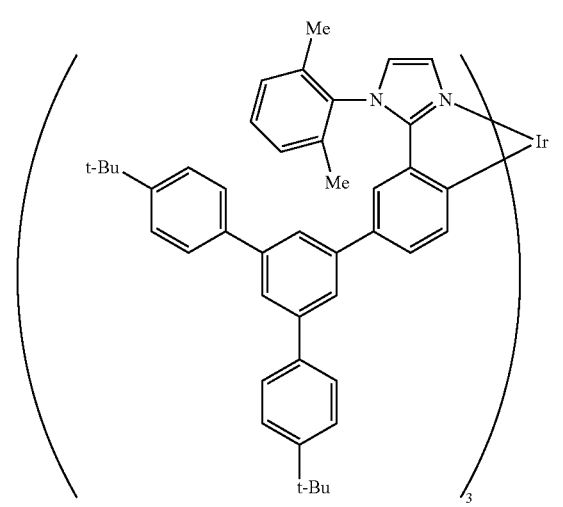

-continued

COM-19

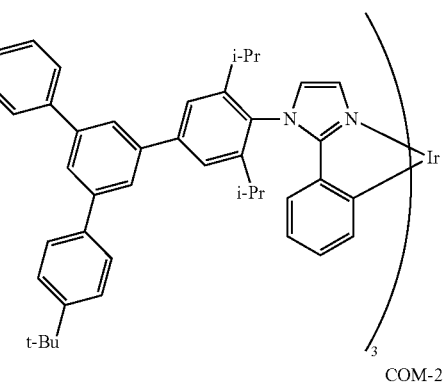

COM-20

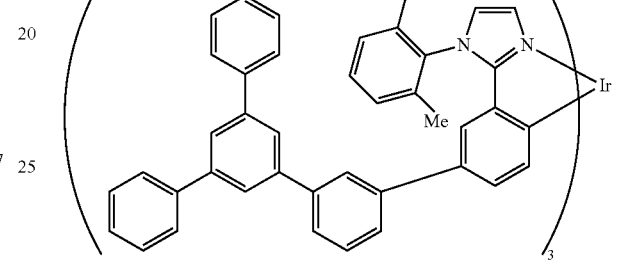

COM-21

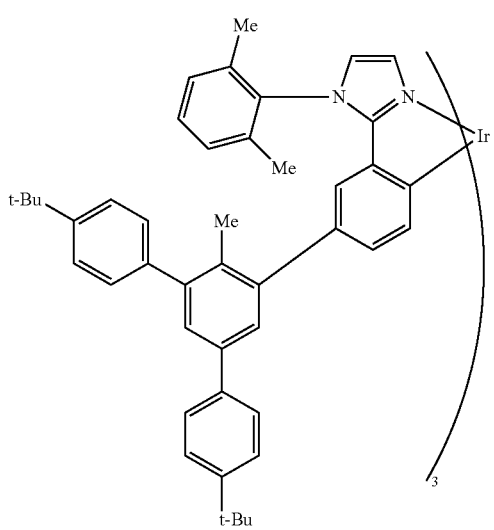

In the film for light emitting device of the present invention, the content of a light emitting material is usually 0.1 to 400 parts by mass with respect to 100 parts by mass of a cross-linked body having a crosslinking group. The light emitting material may be used singly or in combination of two or more.

[Antioxidant]

The antioxidant may be a compound which is soluble in the same solvent as for a crosslinkable material having a crosslinking group and does not inhibit light emission and charge transportation, and includes, for example, phenol type antioxidants and phosphorus-based antioxidants. In the film for light emitting device of the present invention, the compounding amount of the antioxidant is usually 0.001 to 10 parts by mass with respect to 100 parts by mass of the cross-linked body having a crosslinking group. The antioxidant may be used singly or in combination of two or more.

3. Analysis of Crosslinking Group in Film for Light Emitting Device

Analysis of the amount of a crosslinking group contained in the film for light emitting device of the present invention can be carried out by peeling the film for light emitting device of the present invention from a substrate, performing solid-liquid extraction with a solvent, and quantifying a crosslinking group contained in the insoluble component. In quantification of a crosslinking group contained in the film for light emitting device, a light emitting device after fabrication may be used, or a light emitting device containing a cross-linked body having a crosslinking group during fabrication may be used. For example, when the light emitting device contains a cathode, it is necessary to remove the cathode selectively since the cathode is insoluble in a solvent, and it is possible to remove the cathode by peeling off from a substrate using an adhesive tape and the like.

For peeling the film for light emitting device of the present invention from a substrate, for example, the film for light emitting device can be collected by scraping it from a substrate using a spatula and the like. When a hydrophilic hole injection layer is disposed between a substrate and the film for light emitting device of the present invention, the film for light emitting device of the present invention can also be collected, for example, by immersing a substrate in a solvent dissolving a hole injection layer such as water and the like, to dissolve the hole injection layer.

The solvent used for solid-liquid extraction includes, for example, chlorinated hydrocarbon solvents such as chloroform, 1,2-dichloroethane, 1,1,2-trichloroethane, chlorobenzene, o-dichlorobenzene and the like; ether solvents such as tetrahydrofuran, dioxane, anisole, 4-methylanisole and the like; aromatic hydrocarbon solvents such as toluene, xylene, mesitylene, ethylbenzene, n-hexylbenzene, cyclohexylbenzene and the like; aliphatic hydrocarbon solvents such as cyclohexane, methylcyclohexane, n-pentane, n-hexane, n-heptane, n-octane, n-nonane, n-decane, n-dodecane, bicyclohexyl and the like; ketone solvents such as acetone, methyl ethyl ketone, cyclohexanone, acetophenone and the like; ester solvents such as ethyl acetate, butyl acetate, ethyl cellosolve acetate, methyl benzoate, phenyl acetate and the like; polyhydric alcohol solvents such as ethylene glycol, glycerin, 1,2-hexanediol and the like; alcohol solvents such as isopropyl alcohol, cyclohexanol and the like; sulfoxide solvents such as dimethyl sulfoxide and the like; amide solvents such as N-methyl-2-pyrrolidone, N,N-dimethylformamide and the like; and water, and deuterides thereof. The solvent used for solid-liquid extraction may be used singly or in combination of two or more.

The solvent used for solid-liquid extraction is preferably a deuteride, more preferably deuterated tetrahydrofuran, deuterated toluene, deuterated chloroform or deuterated water, further preferably deuterated tetrahydrofuran or deuterated water.

The method for quantifying a crosslinking group contained in the film for light emitting device of the present invention includes, for example, methods of analyzing by nuclear magnetic resonance spectroscopy or infrared spectroscopy, and a method of analyzing by solid nuclear magnetic resonance spectroscopy is preferable. The method of analyzing by solid nuclear magnetic resonance spectroscopy includes, for example, a method in which the film for light emitting device of the present invention is immersed in a deuterated solvent to swell the film for light emitting device of the present invention, then, this film is measured by solid nuclear magnetic resonance spectroscopy. The deuterated solvent for swelling the film for light emitting device of the present invention includes, for example, deuterated tetrahydrofuran, deuterated toluene and deuterated chloroform, and deuterated toluene is preferable.

The method for quantifying a crosslinking group contained in the film for light emitting device of the present invention will be explained in detail. First, the mass of the film for light emitting device of the present invention dried under reduced pressure is measured, the dried film if immersed in a deuterated solvent for a prescribed time, to swell the film. The immersion time is usually 1 minute to 7 days, preferably 1 hour to 3 days, more preferably 10 hours to 40 hours. Thereafter, the swollen film for light emitting device of the present invention is put into a sample tube for solid nuclear magnetic resonance spectroscopy, and $^1$H solid nuclear magnetic resonance spectroscopy is performed. The amount of a crosslinking group contained in the film for light emitting device of the present invention is calculated by an external standard method. As a standard substance, compounds which are dissolved in the deuterated solvent used in the present invention and having $^1$H can be used.

Examples of analysis of the amount of a crosslinking group contained in the film for light emitting device of the present invention will be explained in detail in examples described later.

4. Light Emitting Device

The light emitting device of the present embodiment is a light emitting device having an anode, a cathode and an organic layer wherein the above-described organic layer is disposed between the above-described anode and the above-described cathode, and the above-described organic layer contains the film for light emitting device of the present invention. The organic layer includes, for example, a light emitting layer, a hole transporting layer, a hole injection layer, an electron transporting layer, an electron injection layer and the like. At least one of these layers is the film for light emitting device of the present invention.

[Layer Constitution]

The film for light emitting device of the present invention is usually at least one layer selected from the group consisting of a light emitting layer, a hole transporting layer, a hole injection layer, an electron transporting layer and an electron injection layer, and a hole transporting layer is preferable. These layers contain a light emitting material, a hole transporting material, a hole injection material, an electron transporting material and an electron injection material, respectively. These layers can be formed by dissolving a light emitting material, a hole transporting material, a hole injection material, an electron transporting material and an electron injection material, respectively, in the above-described solvent to prepare inks, and using the same method as for fabrication of a film described above.

The light emitting device has a light emitting layer between an anode and a cathode. For the light emitting device of the present embodiment, it is preferable that at least one of a hole injection layer and a hole transporting layer is disposed between an anode and a light emitting layer from the standpoint of hole injectability and hole transportability, and it is preferable that at least one of an electron injection layer and an electron transporting layer is disposed between a cathode and a light emitting layer from the standpoint of electron injectability and electron transportability.

The materials of a hole transporting layer, an electron transporting layer, a light emitting layer, a hole injection layer and an electron injection layer include the hole transporting material, the electron transporting material, the light emitting material, the hole injection material and the electron injection material described above and the like, respectively, in addition to materials contained in the film for light emitting device of the present invention.

When the material of a hole transporting layer, the material of an electron transporting layer and the material of a light emitting layer are dissolved in a solvent used in forming layers adjacent to a hole transporting layer, and electron transporting layer and a light emitting layer, respectively, in fabrication of a light emitting device, it is preferable that the material has a crosslinking group for avoiding dissolution of the material in the solvent. The layer can be insolubilized by forming each layer using a material having a crosslinking group, then, crosslinking the crosslinking group.

The method for forming each of a light emitting layer, hole transporting layer, an electron transporting layer, a hole injection layer, an electron injection layer and the like in the light emitting device of the present invention includes, when a low molecular weight compound is used, for example, a method of vacuum vapor deposition from a powder and a method of forming a film from a solution or melted state, and when a polymer compound is used, for example, a method of forming a film from a solution or melted state. The order, the number and the thickness of layers to be laminated are adjusted in consideration of light emission efficiency and luminance life.

[Substrate/Electrode]

The substrate in the light emitting device may advantageously be a substrate on which an electrode can be formed and which does not change chemically in forming an organic layer, and is, for example, a substrate made of a material such as glass, plastic, silicon and the like. When an opaque substrate is used, it is preferable that the electrode farthest from the substrate is transparent or semi-transparent.

The material of the anode includes, for example, electrically conductive metal oxides and semi-transparent metals, preferably includes indium oxide, zinc oxide, tin oxide; electrically conductive compounds such as indium-tin-oxide (ITO), indium-zinc-oxide and the like; argentine-palladium-copper (APC) complex; NESA, gold, platinum, silver and copper.

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of at least one of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode each may have a laminated structure composed of two or more layers.

[Application]

The light emitting device of the present embodiment can be used for displays of computers, televisions, portable terminals, and the like. The planar light emitting device can be suitably used as a planar light source for backlight of a liquid crystal display, or as a planar light source for illumination. If a flexible substrate is used, it can be used also as a curved light source and a curved display.

EXAMPLES

The present invention will be illustrated further in detail by examples below, but the present invention is not limited to these examples.

In Example, the polystyrene-equivalent number-average molecular weight (Mn) and the polystyrene-equivalent weight-average molecular weight (Mw) of a polymer compound were determined by size exclusion chromatography (SEC) described below using tetrahydrofuran as a mobile phase.

A polymer compound to be measured was dissolved at a concentration of about 0.05% by mass in tetrahydrofuran, and 10 μL of the solution was injected into SEC. The mobile phase was run at a flow rate of 1.0 mL/min. As the column, PLgel MIXED-B (manufactured by Polymer Laboratories) was used. As the detector, UV-VIS detector (manufactured by Tosoh Corp., trade name: UV-8320GPC) was used.

<Synthesis of Raw Material Compound>

A compound M1 was synthesized according to a method described in JP-A No. 2011-174062.

A compound M2 was synthesized according to a method described in International Publication WO2005/049546.

A compound M3 was synthesized according to a method described in JP-A No. 2008-106241.

A compound M4 was synthesized according to a method described in JP-A No. 2010-215886.

A compound M5 and a compound M7 were synthesized according to a method described in JP-A No. 2010-189630.

A compound M6 was synthesized according to a method described in International Publication WO2012/086671.

A compound M8 was synthesized according to a method described in International Publication WO2013/146806.

A compound M9 and a compound M10 were synthesized according to a method described in International Publication WO2017/047644.

[Chemical Formula 55]

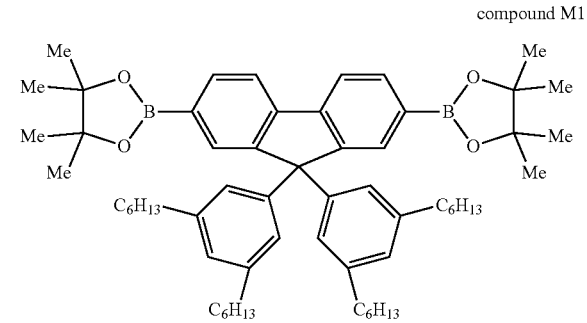

compound M1

-continued compound M2
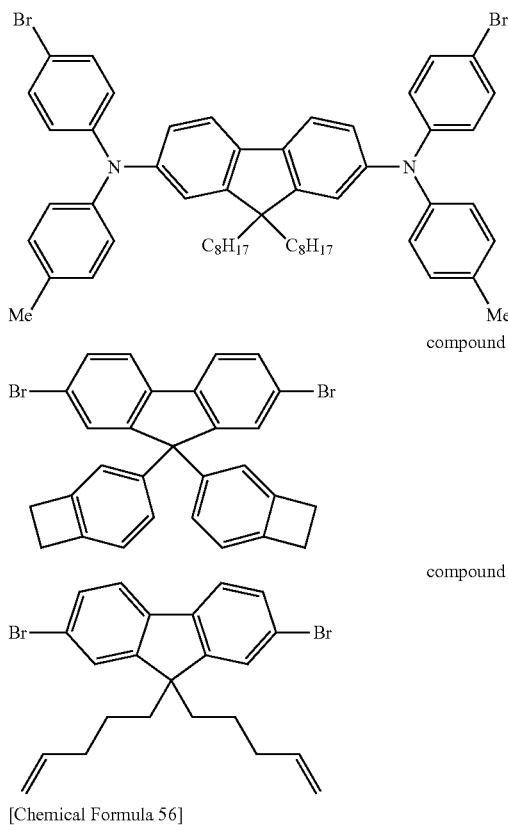

compound M3 compound M4

[Chemical Formula 56]

compound M5
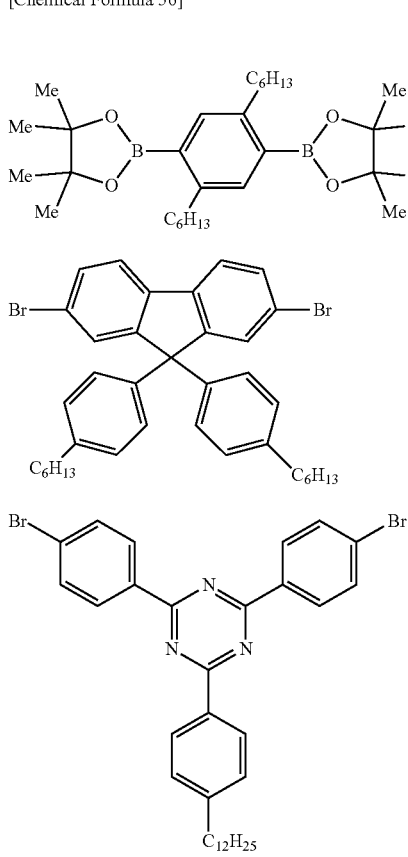

compound M6 compound M7

-continued

[Chemical Formula 57]

compound M8
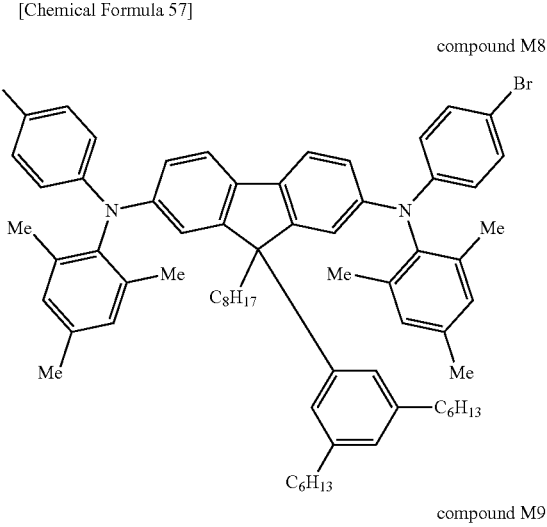

compound M9
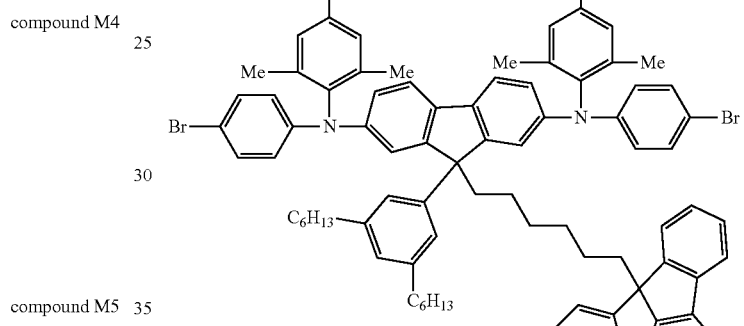

compound M10
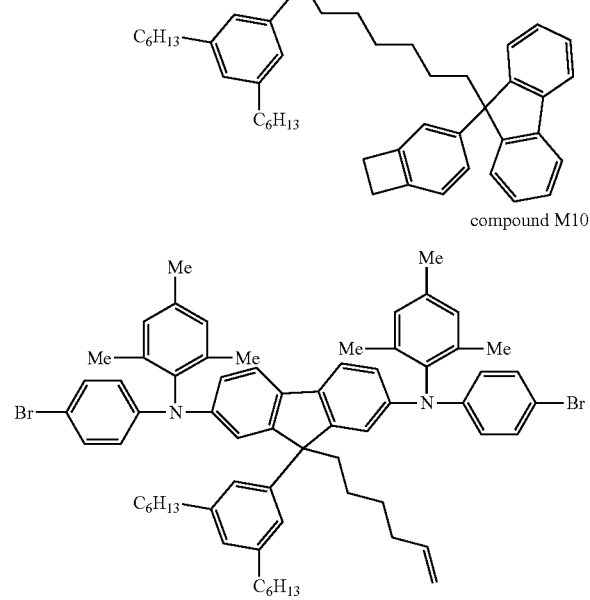

<Synthesis Example 1> Synthesis of Polymer Compound HP-1

A polymer compound HP-1 was synthesized according to a method described in JP-A No. 2012-036388 using the compound M5, the compound M6 and the compound M7. The polymer compound HP-1 had an Mn of $9.6 \times 10^4$ and an Mw of $2.2 \times 10^5$.

The polymer compound HP-1 is a copolymer constituted of a constitutional unit derived from the compound M5, a constitutional unit derived from the compound M6 and a constitutional unit derived from the compound M7 at a molar ratio of 50:40:10 according to the theoretical values calculated from the molar ratio of the charging raw materials.

<Synthesis Example 2> Synthesis of Metal Complex G1

A metal complex G1 was synthesized with reference to a method described in International Publication WO2009/131255.

[Chemical Formula 58]

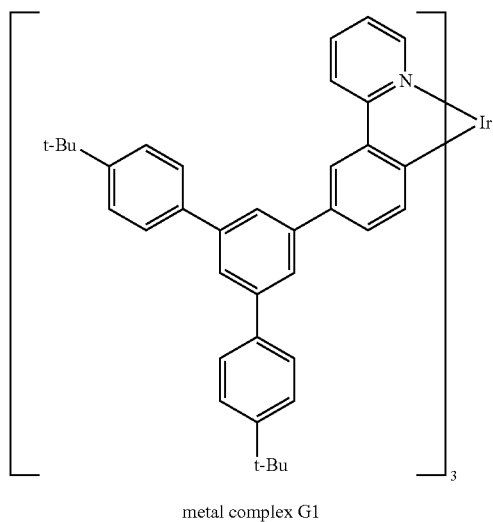

metal complex G1

<Synthesis Example 3> Synthesis of Polymer Compound HTL-1

A polymer compound HTL-1 was synthesized according to a method described in International Publication WO2016/047536 using the compound M1, the compound M8, the compound M9 and the compound M10. The polymer compound HTL-1 had a polystyrene-equivalent number-average molecular weight and a polystyrene-equivalent weight-average molecular weight of Mn=4.5×10$^4$ and Mw=1.5×10$^5$, respectively.

The polymer compound HTL-1 is a copolymer constituted of a constitutional unit derived from the compound M1, a constitutional unit derived from the compound M2, a constitutional unit derived from the compound M3 and a constitutional unit derived from the compound M4 at a molar ratio of 50:40:5:5 according to the theoretical values calculated from the molar ratio of the charging raw materials.

<Synthesis Example 4> Synthesis of Polymer Compound HTL-2

A polymer compound HTL-2 was synthesized according to a method described in International Publication WO2017/047644 using the compound M1, the compound M8, the compound M9 and the compound M10. The polystyrene-equivalent number-average molecular weight and the polystyrene-equivalent weight-average molecular weight of the polymer compound HTL-2 were Mn=2.0×10$^5$ and Mw=2.7×10$^5$, respectively. The polymer compound HTL-2 is a copolymer constituted of a constitutional unit derived from the compound M1, a constitutional unit derived from the compound M8, a constitutional unit derived from the compound M9 and a constitutional unit derived from the compound M10 at a molar ratio of 50:30:10:10 according to the theoretical values calculated from the molar ratio of the charging raw materials.

<Example 1> Fabrication and Evaluation of Light Emitting Device D1

(Formation of Anode and Hole Injection Layer)

An ITO film was attached with a thickness of 45 nm to a glass substrate by a sputtering method, to form an anode. On the anode, ND-3202 (manufactured by Nissan Chemical Industries, Ltd.) as a hole injection material was spin-coated to form a film which was then heated on a hot plate at 50° C. for 3 minutes, and further, heated at 240° C. for 15 minutes, to form a hole injection layer with a thickness of 65 nm.

(Formation of Hole Transporting Layer)

The polymer compound HTL-1 was dissolved in xylene, to obtain a xylene solution having a concentration of 0.7% by mass. This xylene solution was spin-coated on the hole injection layer to form a film which was then heated on at hot plate at 190° C. for 60 minutes under a nitrogen gas atmosphere, to form a hole transporting layer with a thickness of 20 nm. By this heating, the polymer compound HTL-1 became a cross-linked body.

(Formation of Light Emitting Layer)

The polymer compound HP-1 and the metal complex G1 (polymer compound HP-1/metal complex G1=70% by mass/30% by mass) were dissolved in xylene, to obtain a xylene solution having a concentration of 2% by mass. This xylene solution was spin-coated on the second organic layer to form a film which was then heated at 150° C. for 10 minutes under a nitrogen gas atmosphere, to form a light emitting layer with a thickness of 80 nm.

(Formation of Cathode)

The substrate carrying the light emitting layer formed thereon was placed in a vapor deposition machine and the internal pressure thereof was reduced to 1.0×10$^{-4}$ Pa or less, then, as cathode, sodium fluoride was vapor-deposited with a thickness of about 4 nm on the light emitting layer, then, aluminum was vapor-deposited with a thickness of about 80 nm on the sodium fluoride layer. After vapor deposition, sealing was performed using a glass substrate, to fabricate a light emitting device D1.

(Evaluation of Light Emitting Device)

Voltage was applied to the light emitting device D1, to observe EL emission. The current value was set so that the initial luminance was 20000 cd/m$^2$, then, the device was driven at constant current, and the time until the luminance reached 95% of the initial luminance (hereinafter, referred to as "LT95") was measured. The larger the LT95, the better the luminance life. The results are shown in Table 2.

(Quantification of Crosslinking Group)

Quantification of a crosslinking group in the light emitting device D1 was performed by the following method.

(Step 1)

An ITO film was attached with a thickness of 45 nm to a glass substrate by a sputtering method, to form an anode. On the anode, ND-3202 (manufactured by Nissan Chemical Industries, Ltd.) as a hole injection material was spin-coated to form a film which was then heated on a hot plate at 50° C. for 3 minutes, and further, heated at 240° C. for 15 minutes, to form a layer 1 with a thickness of 65 nm.

(Step 2)

Next, the polymer compound HTL-1 was dissolved in xylene, to obtain a xylene solution having a concentration of 0.7% by mass. This xylene solution was spin-coated on the layer 1 to form a film which was then heated on a hot plate at 190° C. for 60 minutes under a nitrogen gas atmosphere to form a film with a thickness of 20 nm, to obtain a laminate 1. By this heating, the polymer compound HTL-1 became a cross-linked body.

(Step 3)

Next, the resultant laminate 1 was immersed in water, to peel off the film from the substrate. The film was collected, and solid-liquid extraction was performed using deuterated tetrahydrofuran and deuterated water, and insoluble components were dried at 100° C. for 60 minutes in a vacuum drier. The mass (A) of the dried film was measured, then, the dried film was immersed in 1 ml of deuterated toluene for 40 hours. The swollen film was charged in a sample tube for solid nuclear magnetic resonance spectroscopy having a diameter of 4 mm, and $^1$H solid nuclear magnetic resonance spectroscopy was carried out under the following conditions.

apparatus: ECA-400 manufactured by JEOL Ltd.
temperature: 50° C.
MAS rotation frequency: 5 kHz
observation frequency: 399.78 MHz
chemical shift standard: 2.08 ppm for $CH_3$ group of toluene The integral intensity (B1) of a signal derived from the crosslinking group XL-1 (vinyl group) detected at 5.48 ppm and the integrated intensity (B17) of a signal derived from the crosslinking group XL-17 (benzocyclobutenyl group) detected at 2.90 ppm were calculated. The number of $^1$H carried on XL-1 detected at 5.48 ppm was one ($CH_2$=C H—)(C1), and the number of $^1$H carried on the crosslinking group XL-17 detected at 2.90 ppm was four (C17).

Adamantane (E) (0.00062 g) was put into a sample tube for solid nuclear magnetic resonance spectroscopy having a diameter of 4 mm and an appropriate amount of a deuterated solvent was added, $^1$H solid nuclear magnetic resonance spectroscopy was carried out under the same conditions as for the swollen film for light emitting device of the present invention, and the integral intensity (D) per 1 mol of $^1$H was calculated from the integral intensity (F) of a signal derived from adamantane according to the following formula.

integrated intensity $(D)$ per 1 mol of $^1H = F/(E/136.23 \times 16)$

The amount of the crosslinking group contained in the film was calculated by the following formula. The results are shown in Table 2.

Total amount of crosslinking group contained in film$=(B1/C1/D/A)+(B17/C17/D/A)$ Examples 2 to 4 and Comparative Examples 1 to 2

Fabrication and Evaluation of Light Emitting Devices D2 to D4, CD1 to CD2

Light emitting devices D2, D3, D4, CD1 and CD2 were fabricated in the same manner as in Example 1 except that heating conditions described in Table 2 were used instead of "heating at 190° C. for 60 minutes" in (Formation of hole transporting layer) in Example 1. Voltage was applied to the light emitting devices D2, D3, D4, CD1 and CD2, to observe EL emission. The measurement results of LT95 are shown in Table 2.

Further, the amount of a crosslinking group contained in the film in the light emitting devices D2, D3, D4, CD1 and CD2 was calculated in the same manner as in Example 1 except that heating conditions described in Table 2 were used instead of "heating at 190° C. for 60 minutes" in (Step 2) in Quantification of crosslinking group of light emitting device D1. The results are shown in Table 2.

In Table 2, LT95 of the light emitting devices D1 to D4 and CD2 is shown in terms of the relative value when LT95 of the light emitting device CD1 was taken as 1.00.

TABLE 2

| | light emitting device | hole transporting layer heating condition | LT95 (relative value) | amount of cross-linking group [mmol/g] |
|---|---|---|---|---|
| Example 1 | D1 | 190° C., 60 minutes | 1.64 | 0.049 |
| Example 2 | D2 | 200° C., 60 minutes | 1.78 | 0.043 |
| Example 3 | D3 | 210° C., 60 minutes | 1.55 | 0.025 |
| Example 4 | D4 | 220° C., 60 minutes | 1.58 | 0.018 |
| Comparative Example 1 | CD1 | 180° C., 60 minutes | 1.00 | 0.055 |
| Comparative Example 2 | CD2 | 230° C., 60 minutes | 1.22 | 0.012 |

Examples 5 to 6 and Comparative Examples 3 to 4

Fabrication and Evaluation of Light Emitting Devices D5 to D6, CD3 to CD4

Light emitting devices D5, D6, CD3 and CD4 were fabricated in the same manner as in Example 1 except that "polymer compound HTL-2" was used instead of "polymer compound HTL-1" in (Formation of hole transporting layer) in Example 1, and heating conditions described in Table 3 were used instead of "heating at 190° C. for 60 minutes". Voltage was applied to the light emitting devices D5, D6, CD3 and CD4, to observe EL emission. Additionally, measurement of LT95 was carried out in the same manner as in Example 1 except that "8000 cd/m$^2$" was applied instead of "20000 cd/m$^2$" in (Evaluation of light emitting device) in Example 1. The measurement results of LT95 are shown in Table 3.

Further, the amount of a crosslinking group contained in the film in the light emitting devices D5, D6, CD3 and CD4 was calculated in the same manner as in Example 1 except that heating conditions described in Table 3 were used instead of "heating at 190° C. for 60 minutes" in (Step 2) in Quantification of crosslinking group of the light emitting device D1. The results are shown in Table 3.

In Table 3, LT95 of the light emitting devices D5 to D6 and CD4 is shown in terms of the relative value when LT95 of the light emitting device CD3 is taken as 1.00.

TABLE 3

| | light emitting device | hole transporting layer heating condition | LT95 (relative value) | amount of cross-linking group [mmol/g] |
|---|---|---|---|---|
| Example 5 | D5 | 210° C., 60 minutes | 1.54 | 0.034 |

TABLE 3-continued

| | light emitting device | hole transporting layer heating condition | LT95 (relative value) | amount of cross-linking group [mmol/g] |
|---|---|---|---|---|
| Example 6 | D6 | 220° C., 60 minutes | 1.47 | 0.015 |
| Comparative Example 3 | CD3 | 180° C., 60 minutes | 1.00 | 0.073 |
| Comparative Example 4 | CD4 | 230° C., 60 minutes | 0.99 | 0.011 |

It was found that excellent luminance life is obtained since a prescribed amount of a crosslinking group is contained in the films for light emitting device used in Examples 1 to 6. That is, it was considered that if the amount of a crosslinking group in the film for light emitting device is large, the cross-linked body having the crosslinking group is likely to be deteriorated, thus the luminance life is shortened. On the other hand, it was considered that if the amount of a crosslinking group in the film for light emitting device is small, the cross-linking density in the film for light emitting device is increased, and accordingly, the quality of the film for light emitting device is deteriorated and the luminance life is shortened.

INDUSTRIAL APPLICABILITY

A light emitting device excellent in luminance life can be produced by using the film for light emitting device of the present invention.

The invention claimed is:
1. A film for light emitting device comprising a cross-linked body having a crosslinking group, wherein said cross-linked body having a crosslinking group is a cross-linked body of a crosslinkable material having a crosslinking group and the amount of said crosslinking group contained in the film for light emitting device is 0.015 mmol/g to 0.05 mmol/g, wherein said crosslinkable material is a low molecular weight compound having at least one crosslinking group selected from Group A of crosslinking group or a polymer compound containing a constitutional unit having at least one crosslinking group selected from Group A of crosslinking group:

(Group A of crosslinking group)

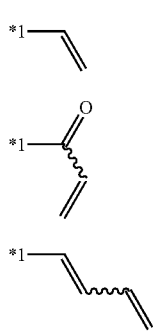 (XL-1)

(XL-2)

(XL-3)

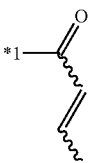 (XL-4)

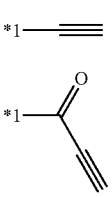 (XL-5)

(XL-6)

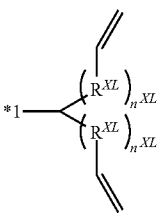 (XL-7)

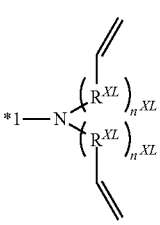 (XL-8)

(XL-9)

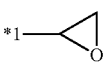 (XL-10)

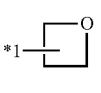 (XL-11)

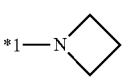 (XL-12)

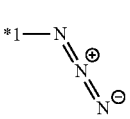 (XL-13)

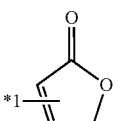 (XL-14)

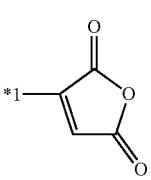 (XL-15)

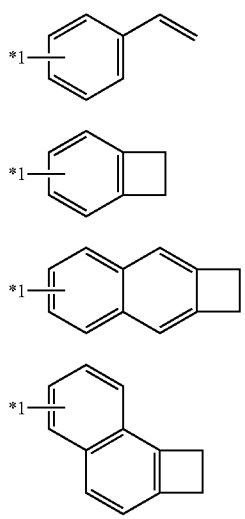

(XL-16)

(XL-17)

(XL-18)

(XL-19)

wherein, $R^{XL}$ represents a methylene group, an oxygen atom, a sulfur atom or —CO—, and $n^{XL}$ represents an integer of 0 to 5, when a plurality of $R^{XL}$ are present, they may be the same or different, a plurality of $n^{XL}$ may be the same or different, *1 represents a binding position, the foregoing crosslinking groups optionally have a substituent, and when a plurality of the substituents are present, they may be combined together to form a ring together with carbon atoms to which they are attached.

2. The film for light emitting device according to claim 1, wherein said crosslinkable material is said polymer compound containing a constitutional unit having at least one crosslinking group selected from Group A of crosslinking group, and said constitutional unit is a constitutional unit represented by the formula (Z) or a constitutional unit represented by the formula (Z'):

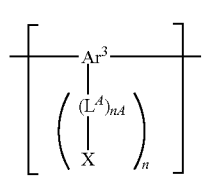

(Z)

wherein, nA represents an integer of 0 to 5, and n represents an integer of 1 to 4, when a plurality of nA are present, they may be the same or different, $Ar^3$ represents an aromatic hydrocarbon group or a heterocyclic group, and the foregoing groups optionally have a substituent, $L^A$ represents an alkylene group, a cycloalkylene group, an arylene group, a divalent heterocyclic group, a group represented by —N(R')—, an oxygen atom or a sulfur atom, and the foregoing groups optionally have a substituent, R' represents a hydrogen atom, an alkyl group, a cycloalkyl group, an aryl group or a monovalent heterocyclic group, and the foregoing groups optionally have a substituent, when a plurality of $L^A$ are present, they may be the same or different, X represents said crosslinking group selected from Group A of crosslinking group, and when a plurality of X are present, they may be the same or different,

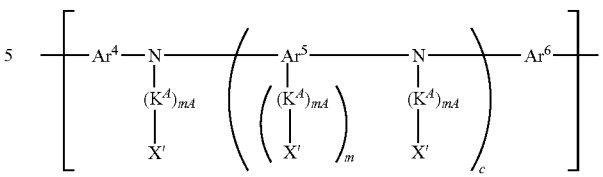

(Z')

wherein, mA represents an integer of 0 to 5, m represent an integer of 1 to 4, and c represents 0 or 1, when a plurality of mA are present, they may be the same or different, $Ar^5$ represents an aromatic hydrocarbon group, a heterocyclic group, or a group in which at least one aromatic hydrocarbon group and at least one heterocyclic group are bonded directly, and the foregoing groups optionally have a substituent, $Ar^4$ and $Ar^6$ each independently represent an arylene group or a divalent heterocyclic group, and the foregoing groups optionally have a substituent, $Ar^4$, $Ar^5$ and $Ar^6$ may be bonded directly or via an oxygen atom or a sulfur atom to groups other than these groups bonded to a nitrogen atom to which these groups are attached, to form a ring, respectively, $K^A$ represents an alkylene group, a cycloalkylene group, an arylene group, a divalent heterocyclic group, a group represented by —N(R")—, an oxygen atom or a sulfur atom, and the foregoing groups optionally have a substituent, R" represents a hydrogen atom, an alkyl group, a cycloalkyl group, an aryl group or a monovalent heterocyclic group, and the foregoing groups optionally have a substituent, when a plurality of $K^A$ are present, they may be the same or different, X' represents said crosslinking group selected from Group A of crosslinking group, a hydrogen atom, an alkyl group, a cycloalkyl group, an aryl group or a monovalent heterocyclic group, and the foregoing groups optionally have a substituent, when a plurality of X' are present, they may be the same or different, and at least one X' is said crosslinking group selected from Group A of crosslinking group.

3. The film for light emitting device according to claim 1, wherein said crosslinkable material is a low molecular weight compound represented by the formula (Z"):

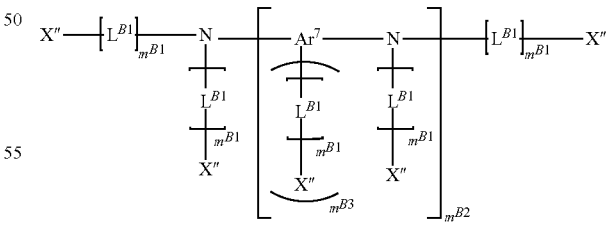

(Z")

wherein, $m^{B1}$, $m^{B2}$ and $m^{B3}$ each independently represent an integer of 0 or more and 10 or less, a plurality of $m^{B1}$ may be the same or different, when a plurality of $m^{B3}$ are present, they may be the same or different, $Ar^7$ represents an aromatic hydrocarbon group, a heterocyclic group, or a group in which at least one aromatic hydrocarbon group and at least one heterocyclic group are bonded directly, and the foregoing groups optionally have a substituent, when a plurality of $Ar^7$ are present, they may be the same or different, $L^{B1}$ represents an alkylene group, a cycloalkylene group, an arylene group, a divalent heterocyclic group, a group represented by —N(R'")—, an oxygen atom or a sulfur atom, and the foregoing groups optionally have a substituent, R'" represents a hydrogen atom, an alkyl group, a cycloalkyl group, an aryl group or a monovalent heterocyclic group, and the foregoing groups optionally have a substituent, when a plurality of $L^{B1}$ are present, they may be the same or different, X" represents said crosslinking group selected from Group A of crosslinking group, a hydrogen atom, an alkyl group, a cycloalkyl group, an aryl group or a monovalent heterocyclic group, and the foregoing groups optionally have a substituent, a plurality of X" may be the same or different, and of the plurality of X", at least one is said crosslinking group selected from Group A of crosslinking group.

4. The film for light emitting device according to claim 1, wherein said crosslinking group includes a crosslinking group represented by said formula (XL-1), said formula (XL-16), said formula (XL-17), said formula (XL-18) or said formula (XL-19).

5. The film for light emitting device according to claim 1, further comprising at least one selected from the group consisting of a hole transporting material, a hole injection material, an electron transporting material, an electron injection material, a light emitting material and an antioxidant.

6. A light emitting device having an anode, a cathode and an organic layer, wherein said organic layer is disposed between said anode and said cathode, and said organic layer is the film for light emitting device according to claim 1.

7. A method for analyzing a crosslinking group in the film of claim 1 for light emitting device, comprising
(1) a step of swelling said film for light emitting device with a solvent, and
(2) a step of measuring a crosslinking group of the swollen film for light emitting device using nuclear magnetic resonance spectroscopy.

* * * * *